(12) United States Patent
Kim et al.

(10) Patent No.: US 8,643,420 B2
(45) Date of Patent: Feb. 4, 2014

(54) INTEGRATED CIRCUIT PULSE GENERATORS

(75) Inventors: Min-Su Kim, Hwaseong-si (KR); Yong-Jin Yoon, Seoul (KR); Ji-Kyum Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/527,214

(22) Filed: Jun. 19, 2012

(65) Prior Publication Data

US 2012/0319753 A1 Dec. 20, 2012

(30) Foreign Application Priority Data

Jun. 20, 2011 (KR) ........................ 10-2011-0059603

(51) Int. Cl.
*H03K 3/017* (2006.01)
*H03K 5/04* (2006.01)
*H03K 7/08* (2006.01)

(52) U.S. Cl.
USPC ............ 327/172; 327/175; 327/291; 327/295

(58) Field of Classification Search
USPC .................................. 327/172, 175, 291, 295
See application file for complete search history.

(56) References Cited

U.S. PATENT DOCUMENTS

| 6,608,513 B2 | 8/2003 | Tschanz et al. |
| 2011/0227624 A1* | 9/2011 | Chou ............................ 327/175 |

FOREIGN PATENT DOCUMENTS

| JP | 1999-136098 | 5/1999 |
| KR | 100188007 B1 | 1/1999 |
| KR | 1020010005237 A | 1/2001 |

* cited by examiner

*Primary Examiner* — John Poos
(74) *Attorney, Agent, or Firm* — Myers Bigel Sibley & Sajovec, P.A.

(57) ABSTRACT

An integrated circuit device includes a clock delay circuit configured to receive a clock signal and a pulse signal and to produce an output signal therefrom. The clock delay circuit is configured to transition the output signal to a first state responsive to a first state of the clock signal and to transition the output signal to a second state responsive to a first state transition of the pulse signal. The integrated circuit device further includes a pulse generator circuit configured to receive the clock signal and the output signal and to produce the pulse signal therefrom. The pulse generator circuit is configured to generate the first state transition in the pulse signal responsive to a transition of the clock signal to a second state and to generate a second state transition in the pulse signal responsive to the transition of the output signal to the second state.

20 Claims, 28 Drawing Sheets

980

990

INTEGRATED CIRCUIT PULSE GENERATORS

CROSS-REFERENCE TO RELATED APPLICATION(S)

This application claims priority under 35 USC §119 to Korean Patent Application No. 10-2011-0059603, filed on Jun. 20, 2011, in the Korean Intellectual Property Office (KIPO), the contents of which are incorporated herein in its entirety by reference.

BACKGROUND

Some embodiments of the inventive subject matter generally relate to integrated circuit devices and, more particularly, to high-speed integrated circuit devices that use pulse-driven circuits.

Pulse-driven circuits are commonly used in integrated circuit devices that operate at high speeds. Examples of pulse generator circuits are described, for example, in U.S. Pat. No. 6,608,513 to Tschanz et al., Japanese Patent Application Publication No. 1999-136098 and Korean Patent Application Publication No. 1020010005237. Generally, there is a need for pulse generators for pulse-driven circuits, such as flip-flop circuits, that can stably maintain a pulse width despite process variation.

SUMMARY

According to some embodiments, a pulse generator includes a pulse generator circuit and an internal clock generator circuit. The pulse generator circuit receives a clock signal and an internal clock signal and configured to generate a first pulse signal that is synchronized with a rising edge of the clock signal with a delay, and the internal clock is synchronized with the clock signal with a delay. The internal clock generator circuit delays the first pulse signal to generate the internal clock signal that determines a pulse width of the first pulse signal, based on at least the clock signal and the first pulse signal.

In some embodiments, the internal clock generator circuit may include at least one p-channel metal oxide semiconductor (PMOS) transistor that has a source connected to a power supply voltage and a gate which receives the clock signal; at least a first n-channel metal oxide semiconductor (NMOS) transistor that is connected between a first node and a ground and a gate which receive the first pulse signal, the first node is being connected to a drain of the PMOS transistor; an inverter circuit configured to invert a logic level of the first node to provide a second node; and second and third NMOS transistors, connected between the first node, the second node and the ground, the second NMOS transistor having a gate which receives the clock signal, the third NMOS transistor having a gate which receives the internal clock signal, the internal clock signal being provided at the second node.

The internal clock generator circuit may further include a second PMOS transistor and a fourth NMOS transistor which have gates receiving at least one control signal that determines the pulse width of the first pulse signal, wherein the second PMOS transistor is connected between the power supply voltage and the first PMOS transistor. The fourth NMOS transistor may be connected between the first node and the ground in parallel with the first NMOS transistor.

The inverter circuit may include an inverter configured to invert the logic level of the first node to provide the internal clock signal.

The inverter may have an input terminal connected to the first node and an output terminal connected to the second node. The inverter circuit may include at least one MOS capacitor connected to at least one of the input terminal and the output terminal.

In some embodiments, the pulse generator circuit may include a first inverter circuit configured to invert the internal clock signal; a NAND gate that performs a NAND operation on the clock signal and an output of the first inverter circuit to generate a second pulse signal which has a phase inverse to a phase of the first pulse signal; and a second inverter circuit that inverts the second pulse signal to provide the first pulse signal.

In some embodiments, the pulse generator circuit may include a first inverter circuit that inverts the internal clock signal; a second inverter circuit that inverts an output of the first inverter circuit; a third inverter circuit that inverts the clock signal to provide an inverted clock signal; and a NOR gate that performs a NOR operation on the inverted clock signal and an output of the second inverter circuit to provide the first pulse signal.

In some embodiments, the pulse generator circuit may include a first inverter circuit that inverts the clock signal to provide an inverted clock signal; a NOR gate that performs a NOR operation on the inverted clock signal and the internal clock signal to provide the first pulse signal; a second inverter circuit that inverts the first pulse signal to provide a second pulse signal which has a phase inverse to a phase of the first pulse signal; and a third inverter circuit that inverts the second pulse signal to be provided to the internal clock generator circuit.

According to some embodiments, a pulse generator includes a pulse generator circuit and an internal clock generator circuit. The pulse generator circuit receives an inverted clock signal and an internal clock signal to generate a first pulse signal that is synchronized with a rising edge of the clock signal with a delay, and the internal clock signal is synchronized with the clock signal with a delay. The internal clock generator circuit delays the second pulse signal to generate the internal clock signal that determines a deactivation interval of the second pulse signal, based on at least the inverted clock signal and the second pulse signal.

In some embodiments, the internal clock generator circuit may include at least a first n-channel channel metal oxide semiconductor (NMOS) transistor that has a source connected to a ground and a gate which receives the inverted clock signal; at least a first p-channel metal oxide semiconductor (PMOS) transistor that is connected between a first node and a power supply voltage and a gate which receive the second signal, the first node is being connected to a drain of the first NMOS transistor; an inverter circuit configured to invert a logic level of the first node to provide a second node; and second and third PMOS transistors, connected between the first node, the second node and the power supply voltage, the second PMOS transistor having a gate which receives the inverted clock signal, the third NMOS transistor having a gate which receives the internal clock signal, the internal clock signal being provided at the second node.

The internal clock generator circuit may further include a second NMOS transistor and a fourth PMOS transistor which have gates receiving at least one control signal that determines the pulse width of the second pulse signal. The second NMOS transistor is connected between the ground and the first NMOS transistor, and the fourth PMOS transistor is connected between the first node and the power supply voltage in parallel with the first PMOS transistor.

In some embodiments, the pulse generator circuit may include a first inverter circuit that inverts the internal clock signal; a NOR gate that performs a NOR operation on the inverted clock signal and an output of the first inverter circuit to generate a first pulse signal which has a phase inverse to a phase of the second pulse signal; and a second inverter circuit that inverts the second pulse signal to provide the first pulse signal.

In some embodiments, the pulse generator circuit may include a first inverter circuit that inverts the internal clock signal; a second inverter circuit that inverts an output of the first inverter circuit; a third inverter circuit that inverts the inverted clock signal to provide a delayed clock signal; and a NAND gate that performs a ANAD operation on the delayed clock signal and an output of the second inverter circuit to provide the second pulse signal.

In some embodiments, the pulse generator circuit may include a first inverter circuit that inverts the inverted clock signal to provide a delayed clock signal; a NAND gate that performs a NAND operation on the delayed clock signal and the internal clock signal to provide the second pulse signal; a second inverter circuit that inverts the second pulse signal to provide a first pulse signal which has a phase inverse to a phase of the second pulse signal; and a third inverter circuit that inverts the first pulse signal to be provided to the internal clock generator circuit.

Accordingly, the pulse generators may be capable of generating pulse signal which maintains pulse width robust to process variation.

According to further embodiments, an integrated circuit device includes a clock delay circuit configured to receive a clock signal and a pulse signal and to produce an output signal therefrom. The clock delay circuit is configured to transition the output signal to a first state responsive to a first state of the clock signal and to transition the output signal to a second state responsive to a first state transition of the pulse signal. The integrated circuit device further includes a pulse generator circuit configured to receive the clock signal and the output signal and to produce the pulse signal therefrom. The pulse generator circuit is configured to generate the first state transition in the pulse signal responsive to a transition of the clock signal to a second state and to generate a second state transition in the pulse signal responsive to the transition of the output signal to the second state. The first and second state transitions of the pulse signal may define a pulse having a duration less than one-half of a period of the clock signal.

In some embodiments, the first state of the clock signal is a logic low state, the second state of the clock signal is a logic high state, the first state transition of the pulse signal is a rising edge and the second state transition of the pulse signal is a falling edge. In some embodiments, the clock delay circuit may include an inverter configured to generate the output signal, a PMOS transistor having a channel coupled between a power supply node and an input of the inverter and a gate configured to receive the clock signal and a NMOS transistor having a channel coupled between the input of the inverter and a ground node and a gate configured to receive the pulse signal.

In further embodiments, the first state of the clock signal is a logic high state, the second state of the clock signal is a logic low state, the first state transition of the pulse signal is a falling edge and the second state transition of the pulse signal is a rising edge. The clock delay circuit may include an inverter configured to generate the output signal, a PMOS transistor having a channel coupled between a power supply node and an input of the inverter and a gate configured to receive the pulse signal and a NMOS transistor having a channel coupled between the input of the inverter and a ground node and a gate configured to receive the clock signal.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
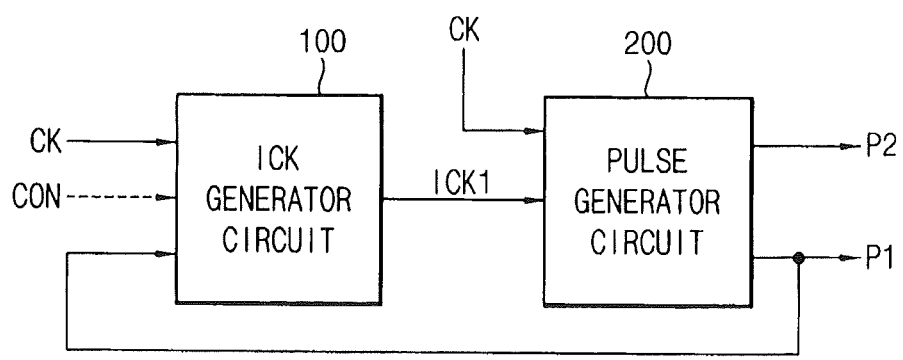
FIG. 1 is a block diagram illustrating a pulse generator according to some embodiments.

Various example embodiments will be described more fully hereinafter with reference to the accompanying drawings, in which some embodiments are shown. The present inventive subject matter may, however, be embodied in many different forms and should not be construed as limited to the example embodiments set forth herein. Rather, these example embodiments are provided so that this disclosure will be thorough and complete, and will fully convey the scope of the present inventive subject matter to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive subject matter. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a pulse generator according to some embodiments.

Referring to FIG. 1, a pulse generator 10 includes an internal clock generator circuit 100 and a pulse generator circuit 200. It will be appreciated that the internal clock generator circuit 100 and the pulse generator circuit 200 may be included in an integrated circuit device.

The internal clock generator circuit 100 may receive a clock signal CK and a first pulse signal P1 to generate an internal clock signal ICK1, such that the internal clock generator circuit 100 acts as a clock delay circuit. The pulse generator circuit 200 may generate at least a first pulse signal P1 based on the clock signal CK and the internal clock signal ICK1. The pulse generator circuit 200 receives the clock signal CK and the internal clock signal ICK1 which is in synchronization with the clock signal CK with a delay to generate at least the first pulse signal P1 which is in synchronization with a rising edge of the clock signal CK with a delay. The internal clock generator circuit 100 delays the first pulse signal P1 to generate the internal clock signal ICK1 that determines a pulse width of the first pulse signal P1, based on at least the clock signal CK and the first pulse signal P1. The internal clock generator circuit 100 may generate the internal clock signal ICK1 based on the clock signal CK, a control signal CON and the first pulse signal P1. The pulse generator circuit 200 may generate the first pulse signal P1 and a second pulse signal P2 based on the clock signal CK and the internal clock signal ICK1. The first pulse signal P1 has a phase inverse to a phase of the second pulse signal P2. That is, the first and second pulse signals P1 and P2 have a phase difference of 180 degrees.

Figure 2:
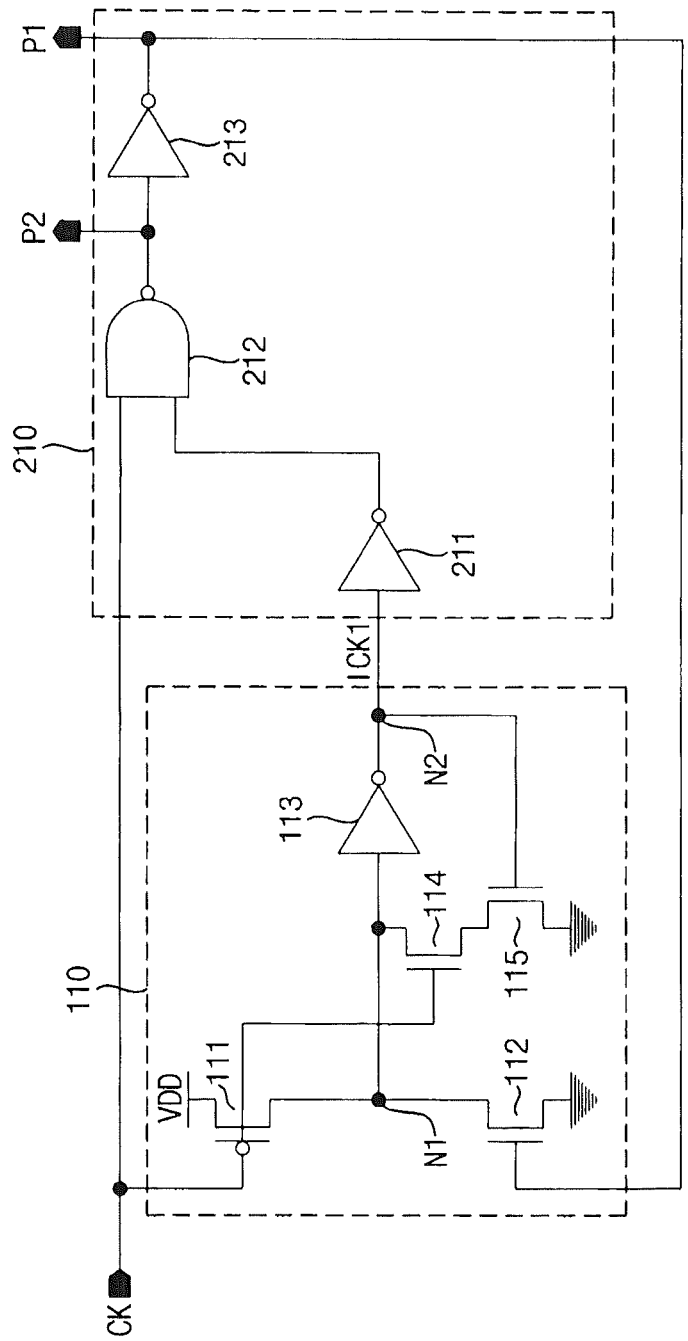
FIG. 2 is a circuit diagram illustrating an example of the pulse generator of FIG. 1 according to some embodiments.

FIG. 2 is a circuit diagram illustrating an example of the pulse generator of FIG. 1 according to some embodiments.

Referring to FIG. 2, a pulse generator 11 includes an internal clock generator circuit 110 and a pulse generator circuit 210.

The internal clock generator circuit 110 includes a p-channel metal oxide semiconductor (PMOS) transistor 111, an n-channel metal oxide semiconductor (NMOS) transistor 112, an inverter circuit 113, and NMOS transistors 114 and 115. The PMOS transistor 111 has a source connected to a power supply voltage VDD, a drain connected to a first node N1 and a gate receiving the clock signal CK. The NMOS transistor 112 has a source connected to a ground, a drain connected to the first node N1 and a gate receiving the first pulse signal P1. The NMOS transistors 114 and 115 are connected between the first node N1 and the ground in parallel with the NMOS transistor 112. The NMOS transistor 114 is connected between the first node N1 and the NMOS transistor 115 and has a gate receiving the clock signal CK. The NMOS transistor 115 is connected between the NMOS transistor 114 and the ground and has a gate receiving the internal clock signal ICK1. The gate of the NMOS transistor 115 is connected to a second node N2. The inverter circuit 113 inverts a logic level of the first node N1 to provide the internal clock signal ICK1 at the second node N2.

The pulse generator circuit 210 includes an inverter circuit 211, a NAND gate 212 and an inverter circuit 213. The inverter circuit 211 inverts the internal clock signal ICK1. The NAND gate 212 performs a NAND operation on the clock signal CK and an output of the inverter circuit 211 to provide the second pulse signal P2. The inverter circuit 213 inverts the second pulse signal P2 to provide the first pulse signal P1. The first pulse signal P1 is provided to the gate of the NMOS transistor 112 in the internal clock generator circuit 110.

When the clock signal CK transitions from a low level to a high level, the second pulse signal P2, output of the NAND gate 212, transitions from a high level to a low level, in synchronization with a rising edge of the clock signal CK with some delay. When the second pulse signal P2 transitions from a high level to a low level, in synchronization with a rising edge of the clock signal CK with some delay, the first pulse signal P1, output of the inverter circuit 213, transitions from a low level to a high level, in synchronization with a rising edge of the clock signal CK with some delay. When the first pulse signal P1 transitions from a low level to a high level, in synchronization with a rising edge of the clock signal CK with some delay, the NMOS transistor 112 is turned on, and the first node N1 is discharged to a level of the ground. When the first node N1 is discharged to the level of the ground, the internal clock signal ICK1 at the second node N2 transitions from a low level to a high level. When the internal clock signal ICK1 at the second node N2 transitions from a low level to a high level, the output of the inverter circuit 211 transitions from a high level to a low level. When the output of the inverter circuit 211 transitions from a high level to a low level, the second pulse signal P2 transitions from a low level to a high level in response to the output of the inverter circuit 211 transitioning to a low level. When the second pulse signal P2 transitions from a low level to a high level, the first pulse signal P1 transitions from a high level to a low level. That is, the first pulse signal P1 transitions to a low level in synchronization with a rising edge of the internal clock signal ICK1 with some delay, a pulse width of the first pulse signal P1 may be determined in response to the rising edge of the internal clock signal ICK1. In addition, the first pulse signal P1 is activated in response to a rising edge of the clock signal CK and is deactivated through five propagation delays including the NAND gate 212, the inverter circuit 213, the NMOS transistor 112, and the inverter circuits 113 and 211 and the NAND gate 212 and the inverter circuit 213.

Figure 3:
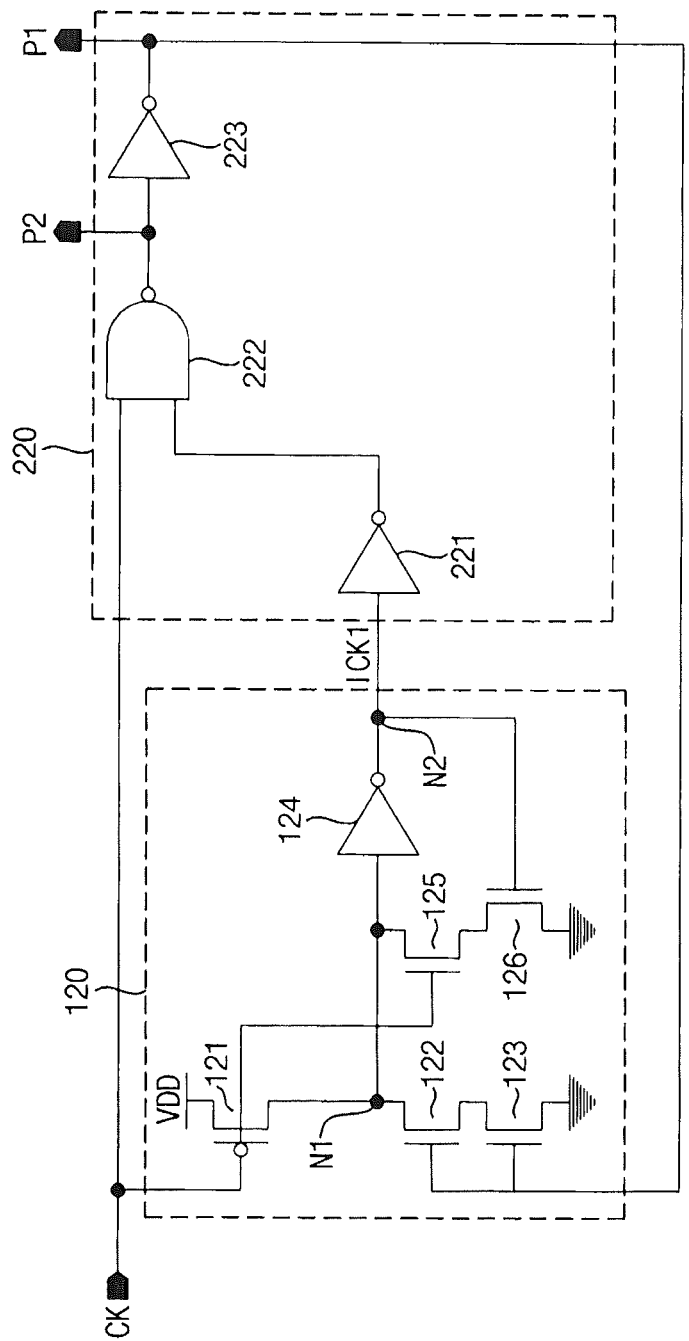
FIG. 3 is a circuit diagram illustrating another example of the pulse generator of FIG. 1 according to some embodiments.

FIG. 3 is a circuit diagram illustrating another example of the pulse generator of FIG. 1 according to some embodiments.

Referring to FIG. 3, a pulse generator 12 includes an internal clock generator circuit 120 and a pulse generator circuit 220.

The internal clock generator circuit 120 includes a PMOS transistor 121, NMOS transistors 122 and 123, an inverter circuit 124, and NMOS transistors 125 and 126. The PMOS transistor 121 has a source connected to a power supply voltage VDD, a drain connected to the first node N1 and a gate receiving the clock signal CK. The NMOS transistors 122 and 123 are connected between the first node N1 and the ground. The NMOS transistor 122 is connected between the first node N1 and the NMOS transistor 123 and has a gate receiving the first pulse signal P1. The NMOS transistor 123 is connected between the NMOS transistor 122 and the ground and has a gate receiving the first pulse signal P1. The NMOS transistors 125 and 126 are connected between the first node N1 and the ground in parallel with the NMOS transistors 122 and 123.

The NMOS transistor 125 is connected between the first node N1 and the NMOS transistor 126 and has a gate receiving the clock signal CK. The NMOS transistor 126 is connected between the NMOS transistor 125 and the ground and has a gate receiving the internal clock signal ICK1. The gate of the NMOS transistor 126 is connected to a second node N2. The inverter circuit 124 inverts a logic level of the first node N1 to provide the internal clock signal ICK1 at the second node N2.

The pulse generator circuit 220 includes an inverter circuit 221, a NAND gate 222 and an inverter circuit 223. The inverter circuit 221 inverts the internal clock signal ICK1. The NAND gate 222 performs a NAND operation on the clock signal CK and an output of the inverter circuit 221 to provide the second pulse signal P2. The inverter circuit 223 inverts the second pulse signal P2 to provide the first pulse signal P1. The first pulse signal P1 is provided to the gate of the NMOS transistors 122 and 123 in the internal clock generator circuit 120.

The pulse generator 12 differs from the pulse generator 11 in that the NMOS transistors 122 and 123 replace the NMOS transistor 112. The NMOS transistors 122 and 123 may more capacitance and resistance than the NMOS transistor 112, and thus may provide more delay than the NMOS transistor 112. Therefore, the pulse width of the pulse generator 12 of FIG. 2 may be wider than that of the pulse generator 11 of FIG. 2. Other operation of the pulse generator 12 is substantially similar to operation of the pulse generator 11, and thus, detailed description on operation of the pulse generator 12 will not be repeated.

Figure 4:
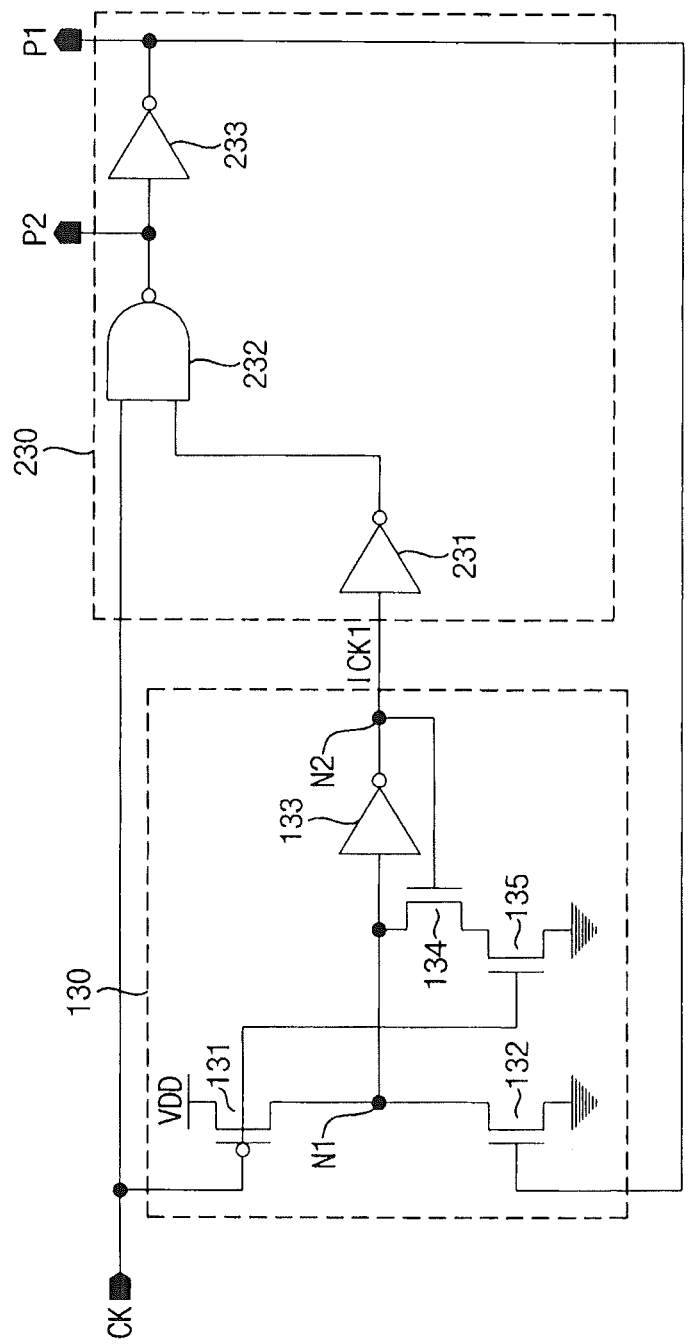
FIG. 4 is a circuit diagram illustrating another example of the pulse generator of FIG. 1 according to some embodiments.

FIG. 4 is a circuit diagram illustrating another example of the pulse generator of FIG. 1 according to some embodiments.

Referring to FIG. 4, a pulse generator 13 includes an internal clock generator circuit 130 and a pulse generator circuit 230.

The internal clock generator circuit 130 includes a PMOS transistor 131, NMOS transistor 132, an inverter circuit 133, and NMOS transistors 134 and 135. The PMOS transistor 131 has a source connected to a power supply voltage VDD, a drain connected to the first node N1 and a gate receiving the clock signal CK. The NMOS transistor 132 is connected between the first node N1 and the ground. The NMOS has a gate receiving the first pulse signal P1. The NMOS transistors 134 and 135 are connected between the first node N1 and the ground in parallel with the NMOS transistor 132. The NMOS transistor 134 is connected between the first node N1 and the NMOS transistor 134 and has a gate receiving the internal clock signal ICK1. The gate of the NMOS transistor 134 is connected to a second node N2. The NMOS transistor 135 is connected between the NMOS transistor 134 and the ground and has a gate receiving the clock signal CK. The inverter circuit 133 inverts a logic level of the first node N1 to provide the internal clock signal ICK1 at the second node N2, The pulse generator circuit 230 includes an inverter circuit 231, a NAND gate 232 and an inverter circuit 233. The inverter circuit 231 inverts the internal clock signal ICK1. The NAND gate 232 performs a NAND operation on the clock signal CK and an output of the inverter circuit 231 to provide the second pulse signal P2. The inverter circuit 233 inverts the second pulse signal P2 to provide the first pulse signal P1. The first pulse signal P1 is provided to the gate of the NMOS transistor 132 in the internal clock generator circuit 130.

The pulse generator 13 of FIG. 4 differs from the pulse generator 11 of FIG. 2 in that the NMOS transistor 134 has the gate receiving the internal clock signal ICK1 and the NMOS transistor 135 has the gate receiving the clock signal CK in the pulse generator 13 of FIG. 4 while the NMOS transistor 114 has the gate receiving the clock signal CK and the NMOS transistor 115 has the gate receiving the internal clock signal ICK1 in the pulse generator 11 of FIG. 2. Other operation of the pulse generator 13 is substantially similar to operation of the pulse generator 11, and thus, detailed description on operation of the pulse generator 13 will not be repeated.

Figure 5:
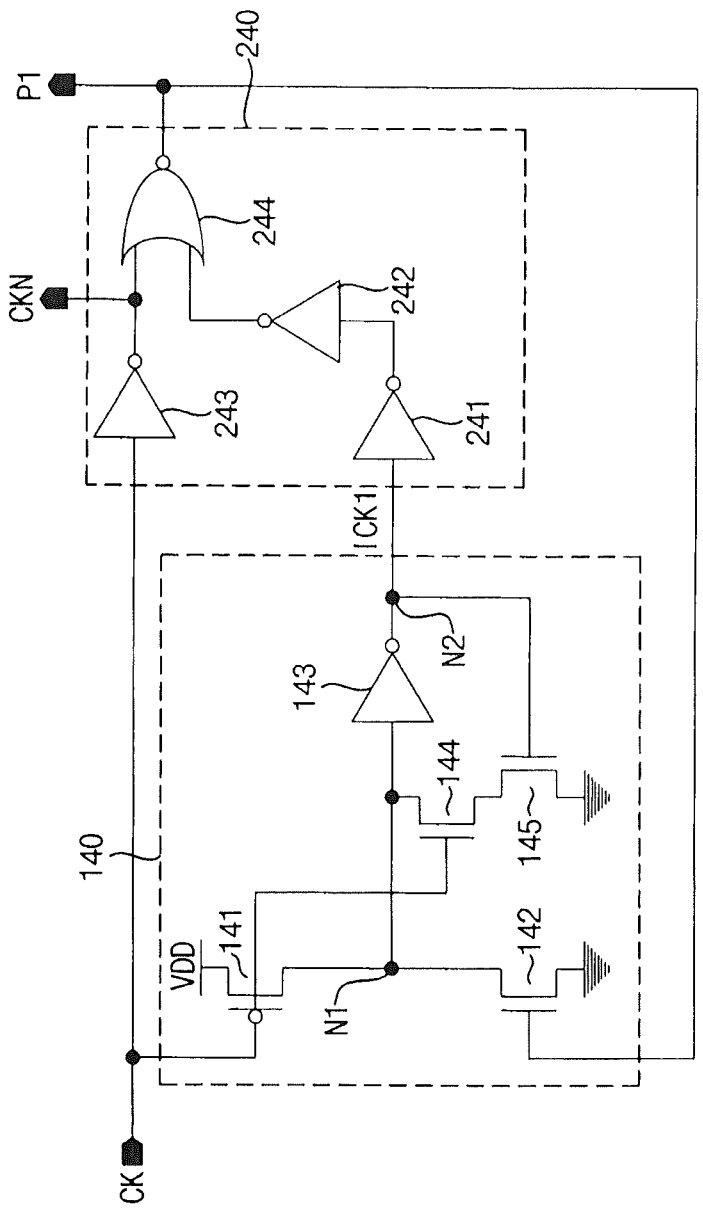
FIG. 5 is a circuit diagram illustrating another example of the pulse generator of FIG. 1 according to some embodiments.

FIG. 5 is a circuit diagram illustrating another example of the pulse generator of FIG. 1 according to some embodiments.

Referring to FIG. 5, a pulse generator 14 includes an internal clock generator circuit 140 and a pulse generator circuit 240.

The internal clock generator circuit 140 includes a PMOS transistor 141, NMOS transistor 142, an inverter circuit 143, and NMOS transistors 144 and 145. The PMOS transistor 141 has a source connected to the power supply voltage VDD, a drain connected to the first node N1 and a gate receiving the clock signal CK. The NMOS transistor 142 is connected between the first node N1 and the ground. The NMOS transistor 142 has a gate receiving the first pulse signal P1. The NMOS transistors 144 and 145 are connected between the first node N1 and the ground in parallel with the NMOS transistor 142. The NMOS transistor 144 is connected between the first node N1 and the NMOS transistor 145 and has a gate receiving the clock signal CK. The NMOS transistor 145 is connected between the NMOS transistor 144 and the ground and has a gate receiving the internal clock signal ICK1. The gate of the NMOS transistor 145 is connected to the second node N2. The inverter circuit 143 inverts a logic level of the first node N1 to provide the internal clock signal ICK1 at the second node N2.

The pulse generator circuit 240 includes inverter circuits 241, 242 and 243 and a NOR gate 244. The inverter circuit 241 inverts the internal clock signal ICK1. The inverter circuit 242 inverts an output of the inverter circuit 241. The inverter circuit 243 inverts the clock signal CK to provide an inverted clock signal CKN. The NOR gate 244 performs a NOR operation on the inverted clock signal CKN and an output of the inverter circuit 242 to provide the first pulse signal P1. The first pulse signal P1 is provided to the gate of the NMOS transistor 142 in the internal clock generator circuit 140.

The pulse generator 14 of FIG. 5 differs from the pulse generator 11 of FIG. 2 in that the pulse generator circuit 240 differs from the pulse generator circuit 210. The pulse generator circuit 240 is substantially an equivalent to the pulse generator circuit 210. Therefore, detailed description on operation of the pulse generator 14 will not be repeated.

Figure 6:
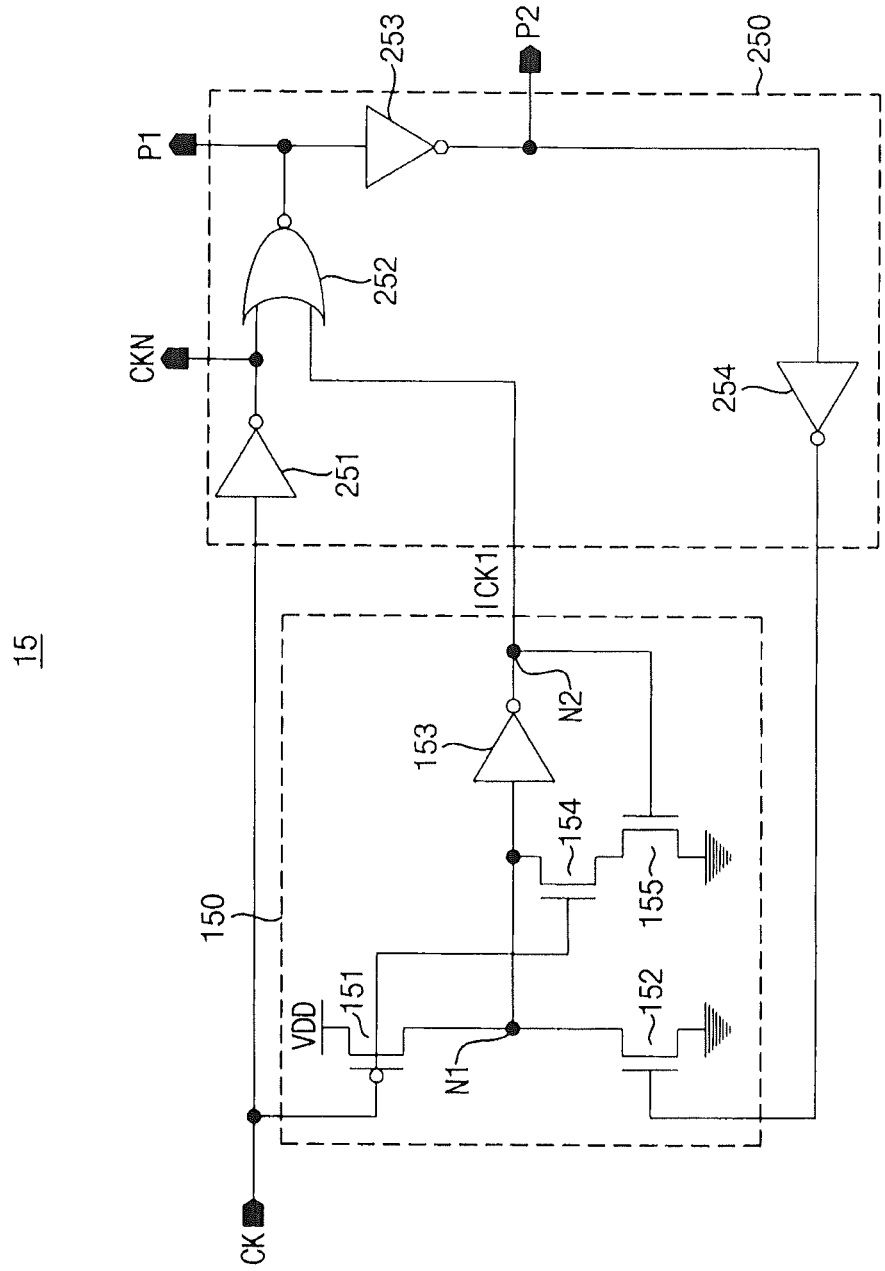
FIG. 6 is a circuit diagram illustrating another example of the pulse generator of FIG. 1 according to some embodiments.

FIG. 6 is a circuit diagram illustrating another example of the pulse generator of FIG. 1 according to some embodiments.

Referring to FIG. 6, a pulse generator 15 includes an internal clock generator circuit 150 and a pulse generator circuit 250.

The internal clock generator circuit 150 includes a PMOS transistor 151, NMOS transistor 152, an inverter circuit 153, and NMOS transistors 154 and 155. The PMOS transistor 151 has a source connected to the power supply voltage VDD, a drain connected to the first node N1 and a gate receiving the clock signal CK. The NMOS transistor 152 is connected between the first node N1 and the ground. The NMOS transistor 152 has a gate receiving the first pulse signal P1. The NMOS transistors 154 and 155 are connected between the first node N1 and the ground in parallel with the NMOS transistor 152. The NMOS transistor 154 is connected between the first node N1 and the NMOS transistor 155 and has a gate receiving the clock signal CK. The NMOS transistor 155 is connected between the NMOS transistor 154 and the ground and has a gate receiving the internal clock signal ICK1. The gate of the NMOS transistor 155 is connected to the second node N2. The inverter circuit 153 inverts a logic level of the first node N1 to provide the internal clock signal ICK1 at the second node N2.

The pulse generator circuit 250 includes an inverter circuit 251, a NOR gate 252 and inverter circuits 253 and 254. The inverter circuit 251 inverts the clock signal CK to provide an inverted clock signal CKN. The NOR gate 252 performs a NOR operation on the inverted clock signal CKN and the internal clock signal ICK1 to provide the first pulse signal P1. The inverter circuit 253 inverts the first pulse signal P1 to provide the second pulse signal P2. The inverter circuit 254 inverts the second pulse signal P2 to provide a delayed first pulse signal. The delayed first pulse signal is provided to the gate of the NMOS transistor 152 in the internal clock generator circuit 150.

The pulse generator 15 of FIG. 6 differs from the pulse generator 11 of FIG. 2 in that the pulse generator circuit 250 differs from the pulse generator circuit 210. The pulse generator circuit 250 is substantially an equivalent to the pulse generator circuit 210. Therefore, detailed description on operation of the pulse generator 15 will not be repeated.

Figure 7:
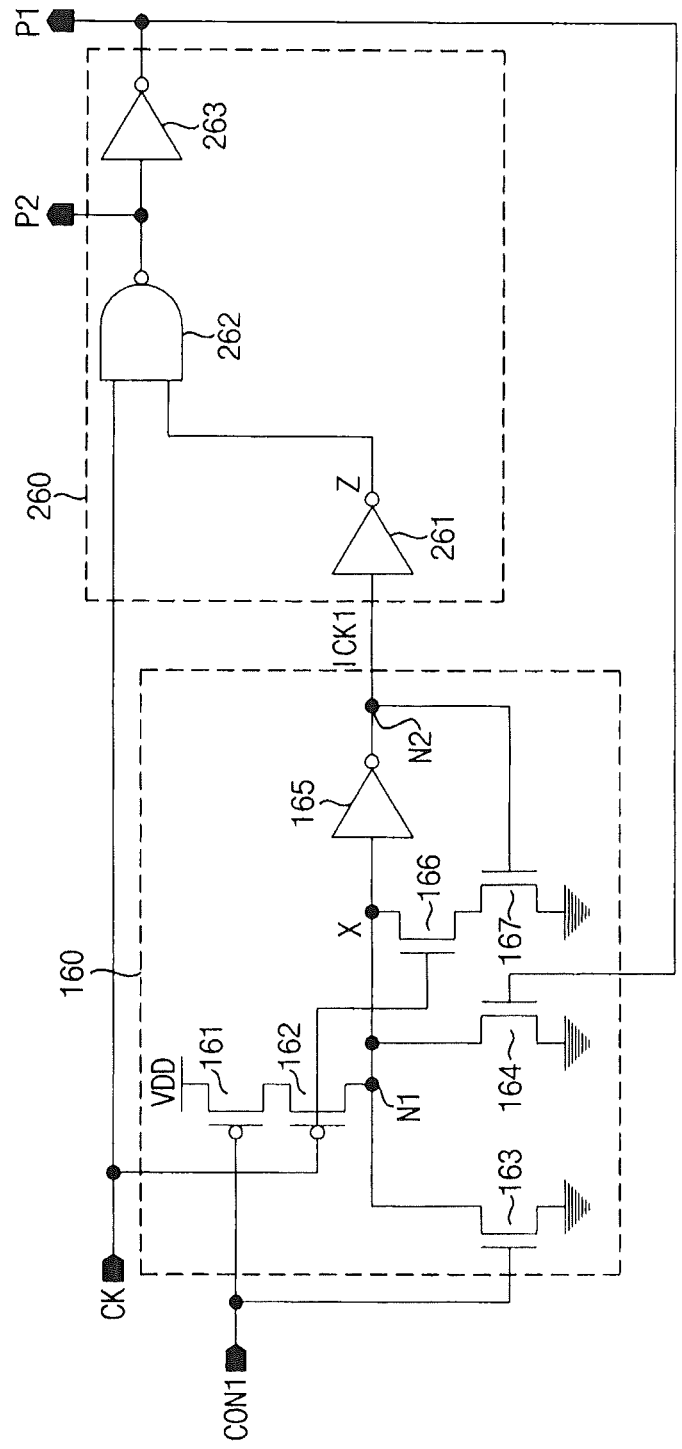
FIG. 7 is a circuit diagram illustrating another example of the pulse generator of FIG. 1 according to some embodiments.

FIG. 7 is a circuit diagram illustrating another example of the pulse generator of FIG. 1 according to some embodiments.

Referring to FIG. 7, a pulse generator 16 includes an internal clock generator circuit 160 and a pulse generator circuit 260.

The internal clock generator circuit 160 includes PMOS transistors 161 and 162, NMOS transistors 163 and 164, an inverter circuit 165, and NMOS transistors 166 and 167. The PMOS transistors 161 and 162 are connected between the power supply voltage VDD and the first node N1. The PMOS transistor 161 has a gate receiving a first control signal CON1, and the PMOS transistor 162 has a gate receiving the clock signal CK. The NMOS transistors 163 and 164 are connected in parallel between the first node N1 and the ground. The NMOS transistor 163 has a gate receiving the first control signal CON1 and the NMOS transistor 164 has a gate receiving the first pulse signal P1. The NMOS transistors 166 and 167 are cascode-connected between the first node N1 and the ground in parallel with the NMOS transistor 164. The NMOS transistor 166 is connected between the first node N1 and the NMOS transistor 167 and has a gate receiving the clock signal CK. The NMOS transistor 167 is connected between the NMOS transistor 166 and the ground and has a gate receiving the internal clock signal ICK1. The gate of the NMOS transistor 167 is connected to the second node N2. The inverter circuit 165 inverts a logic level of the first node N1 to provide the internal clock signal ICK1 at the second node N2.

The pulse generator circuit 260 includes an inverter circuit 261, a NAND gate 262 and an inverter circuit 263. The inverter circuit 261 inverts the internal clock signal ICK1. The NAND gate 262 performs a NAND operation on the clock signal CK and an output of the inverter circuit 261 to provide the second pulse signal P2. The inverter circuit 263 inverts the second pulse signal P2 to provide the first pulse signal P1. The first pulse signal P1 is provided to the gate of the NMOS transistor 164 in the internal clock generator circuit 160.

Hereinafter, there will be description on operation of the pulse generator 16.

When the first control signal CON1 is a low level, the PMOS transistor 161 is turned on and the NMOS transistor 163 is turned off. Therefore, architecture of the pulse generator 16 is substantially the same as architecture of the pulse generator 11 of FIG. 2. When the clock signal CK transitions from a low level to a high level, the second pulse signal P2, output of the NAND gate 262, transitions from a high level to a low level, in synchronization with a rising edge of the clock signal CK with some delay. When the second pulse signal P2 transitions from a high level to a low level, in synchronization with a rising edge of the clock signal CK with some delay, the first pulse signal P1, output of the inverter circuit 263, transitions from a low level to a high level, in synchronization with a rising edge of the clock signal CK with some delay. When the first pulse signal P1 transitions from a low level to a high level, in synchronization with a rising edge of the clock signal CK with some delay, the NMOS transistor 164 is turned on, and the first node N1 is discharged to a level of the ground. When the first node N1 is discharged to the level of the ground, the internal clock signal ICK1 at the second node N2 transitions from a low level to a high level. When the internal clock signal ICK1 at the second node N2 transitions from a low level to a high level, the output of the inverter circuit 261 transitions from a high level to a low level. When the output of the inverter circuit 261 transitions from a high level to a low level, the second pulse signal P2 transitions from a low level to a high level in response to the output of the inverter circuit 263 transitioning to a low level. When the second pulse signal P2 transitions from a low level to a high level, the first pulse signal P1 transitions from a high level to a low level. That is, the first pulse signal P1 transitions to a low level in synchronization with a rising edge of the internal clock signal ICK1 with some delay, a pulse width of the first pulse signal P1 may be determined in response to the rising edge of the internal clock signal ICK1. In addition, the first pulse signal P1 is activated in response to a rising edge of the clock signal CK and is deactivated through five propagation delays including the NAND gate 262, the inverter circuit 263, the NMOS transistor 164, and the inverter circuits 165 and 261 and the NAND gate 262 and the inverter circuit 263.

When the first control signal CON1 is a high level, the PMOS transistor 161 is turned off and the NMOS transistor 163 is turned on. When the NMOS transistor 163 is turned on, the first node N1 is discharged to a level of the ground. When the first node N1 is discharged to a level of the ground, the internal clock signal ICK1 transitions to a high level and the output of the inverter circuit 261 transitions to a low level. When the output of the inverter circuit 261 transitions to a low level, the second pulse signal P2 transitions to a high level and the first pulse signal P1 is deactivated with a low level. That is, when the first control signal CON1 is a high level, the first pulse signal P1 is deactivated with a low level without regard to logic level of the clock signal CK. That is, the pulse generator 16 of FIG. 7 may control activating interval (or pulse width) of the first pulse signal P1 by the first control signal CON1.

Figure 8:
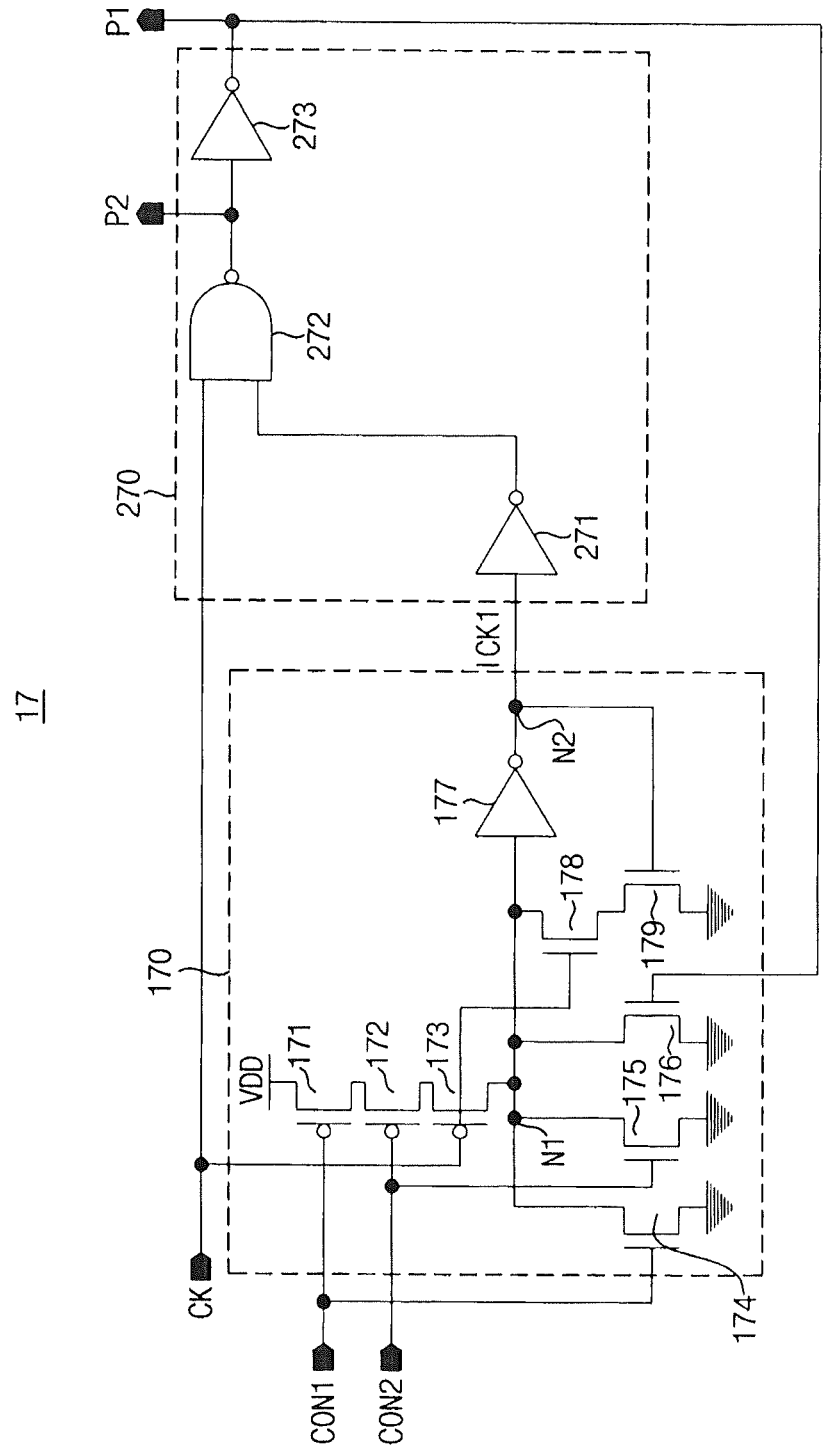
FIG. 8 is a circuit diagram illustrating another example of the pulse generator of FIG. 1 according to some embodiments.

FIG. 8 is a circuit diagram illustrating another example of the pulse generator of FIG. 1 according to some embodiments.

Referring to FIG. 8, a pulse generator 17 includes an internal clock generator circuit 170 and a pulse generator circuit 270.

The internal clock generator circuit 170 includes PMOS transistors 171, 172 and 173, NMOS transistors 174, 175 and 176, an inverter circuit 177, and NMOS transistors 178 and 179. The PMOS transistors 171, 172 and 173 are cascode-connected between the power supply voltage VDD and the first node N1. The PMOS transistor 171 has a gate receiving a first control signal CON1, the PMOS transistor 172 has a gate receiving a second control signal CON2 and the PMOS transistor 173 has a gate receiving the clock signal CK. The NMOS transistors 174, 175 and 176 are connected in parallel between the first node N1 and the ground. The NMOS transistor 174 has a gate receiving the first control signal CON1, the NMOS transistor 175 has a gate receiving the second control signal CON2 and the NMOS transistor 176 has a gate receiving the first pulse signal P1. The NMOS transistors 178 and 179 are cascode-connected between the first node N1 and the ground in parallel with the NMOS transistor 176. The NMOS transistor 178 is connected between the first node N1 and the NMOS transistor 179 and has a gate receiving the clock signal CK. The NMOS transistor 179 is connected between the NMOS transistor 178 and the ground and has a gate receiving the internal clock signal ICK1. The gate of the NMOS transistor 179 is connected to the second node N2. The inverter circuit 177 inverts a logic level of the first node N1 to provide the internal clock signal ICK1 at the second node N2.

The pulse generator circuit 270 includes an inverter circuit 271, a NAND gate 272 and an inverter circuit 273. The inverter circuit 271 inverts the internal clock signal ICK1. The NAND gate 272 performs a NAND operation on the clock signal CK and an output of the inverter circuit 271 to provide the second pulse signal P2. The inverter circuit 273 inverts the second pulse signal P2 to provide the first pulse signal P1. The first pulse signal P1 is provided to the gate of the NMOS transistor 176 in the internal clock generator circuit 170.

Hereinafter, there will be description on operation of the pulse generator 17.

When both of the first and second control signals CON1 and CON2 are low level, the PMOS transistors 171 and 172 are turned on and the NMOS transistors 174 and 175 are turned off. Therefore, architecture of the pulse generator 17 is substantially the same as architecture of the pulse generator 11 of FIG. 2, and thus operation of the pulse generator 17 will not be repeated.

When at least one of the first and second control signals CON1 and CON2 is high level, at least one of the NMOS transistors 174 and 175 are turned on and the first node N1 is discharged to a level of the ground. When the first node N1 is discharged to a level of the ground, the internal clock signal ICK1 transitions to a high level and the output of the inverter circuit 271 transitions to a low level. When the output of the inverter circuit 271 transitions to a low level, the second pulse signal P2 transitions to a high level and the first pulse signal P1 is deactivated with a low level. That is, when at least one of the first and second control signals CON1 and CON2 is high level, the first pulse signal P1 is deactivated with a low level without regard to logic level of the clock signal CK. That is, the pulse generator 17 of FIG. 8 may control activating interval of the first pulse signal P1 by the first and second control signals CON1 and CON2.

Figure 9:
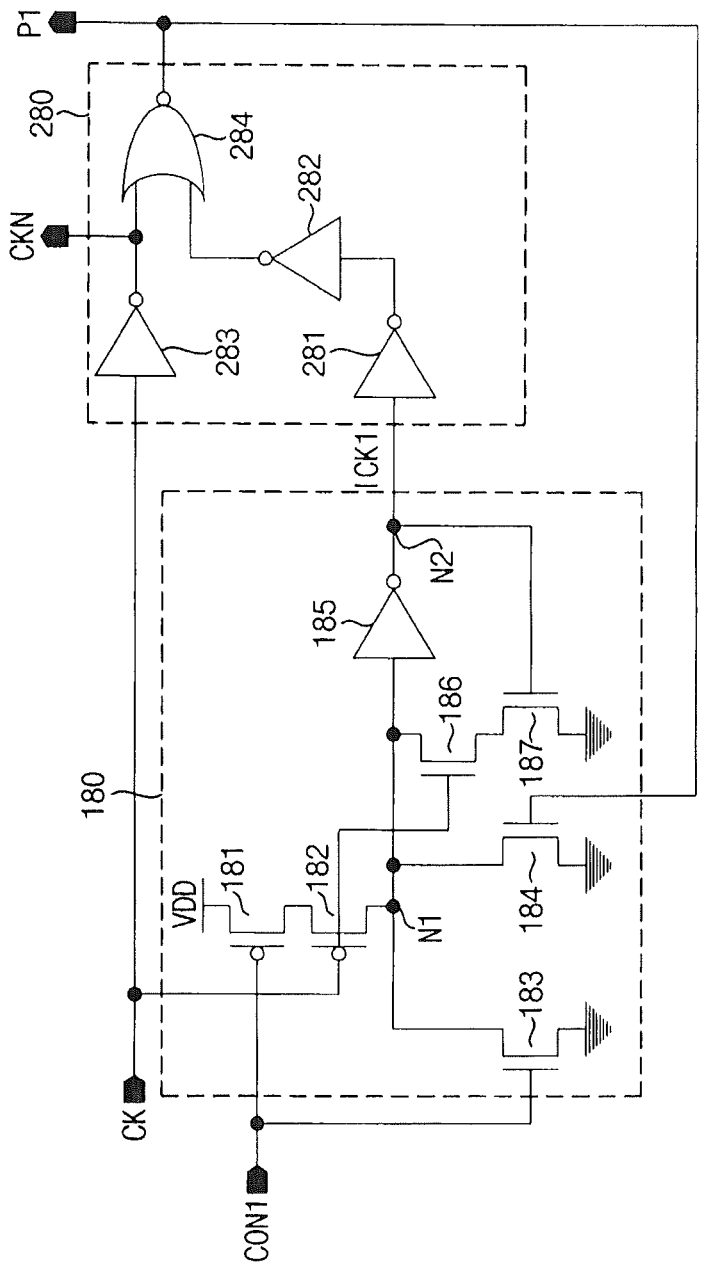
FIG. 9 is a circuit diagram illustrating another example of the pulse generator of FIG. 1 according to some embodiments.

FIG. 9 is a circuit diagram illustrating another example of the pulse generator of FIG. 1 according to some embodiments.

Referring to FIG. 9, a pulse generator 18 includes an internal clock generator circuit 180 and a pulse generator circuit 280.

The internal clock generator circuit 180 includes PMOS transistors 181 and 182, NMOS transistors 183 and 184, an inverter circuit 185, and NMOS transistors 186 and 187. The PMOS transistors 181 and 182 are connected between the power supply voltage VDD and the first node N1. The PMOS transistor 181 has a gate receiving a first control signal CON1, and the PMOS transistor 182 has a gate receiving the clock signal CK. The NMOS transistors 183 and 184 are connected in parallel between the first node N1 and the ground. The NMOS transistor 183 has a gate receiving the first control signal CON1 and the NMOS transistor 184 has a gate receiving the first pulse signal P1. The NMOS transistors 186 and 167 are cascode-connected between the first node N1 and the ground in parallel with the NMOS transistor 184. The NMOS transistor 186 is connected between the first node N1 and the NMOS transistor 187 and has a gate receiving the clock signal CK. The NMOS transistor 187 is connected between the NMOS transistor 166 and the ground and has a gate receiving the internal clock signal ICK1. The gate of the NMOS transistor 187 is connected to the second node N2. The inverter circuit 185 inverts a logic level of the first node N1 to provide the internal clock signal ICK1 at the second node N2.

The pulse generator circuit 280 includes inverter circuits 281, 282 and 283 and a NOR gate 284. The inverter circuit 281 inverts the internal clock signal ICK1. The inverter circuit 282 inverts an output of the inverter circuit 281. The inverter circuit 283 inverts the clock signal CK to provide an inverted clock signal CKN. The NOR gate 284 performs a NOR operation on the inverted clock signal CKN and an output of the inverter circuit 282 to provide the first pulse signal P1. The first pulse signal P1 is provided to the gate of the NMOS transistor 184 in the internal clock generator circuit 180.

Hereinafter, there will be description on operation of the pulse generator 18.

When the first control signal CON1 is a low level, the PMOS transistor 181 is turned on and the NMOS transistor 183 is turned off. Therefore, architecture of the pulse generator 18 is substantially the same as architecture of the pulse generator 14 of FIG. 5, and thus operation of the pulse generator 18 will not be repeated.

When the first control signal CON1 is a high level, the PMOS transistor 181 is turned off and the NMOS transistor 183 is turned on. When the NMOS transistor 183 is turned on, the first node N1 is discharged to a level of the ground. When the first node N1 is discharged to a level of the ground, the internal clock signal ICK1 transitions to a high level and the output of the inverter circuit 281 transitions to a low level. When the output of the inverter circuit 281 is low level, the first pulse signal P1, output of the NOR gate 284, is deactivated with a low level without regard to logic level of the clock signal CK. That is, the pulse generator 18 of FIG. 9 may control activating interval (or pulse width) of the first pulse signal P1 by the first control signal CON1.

Figure 10:
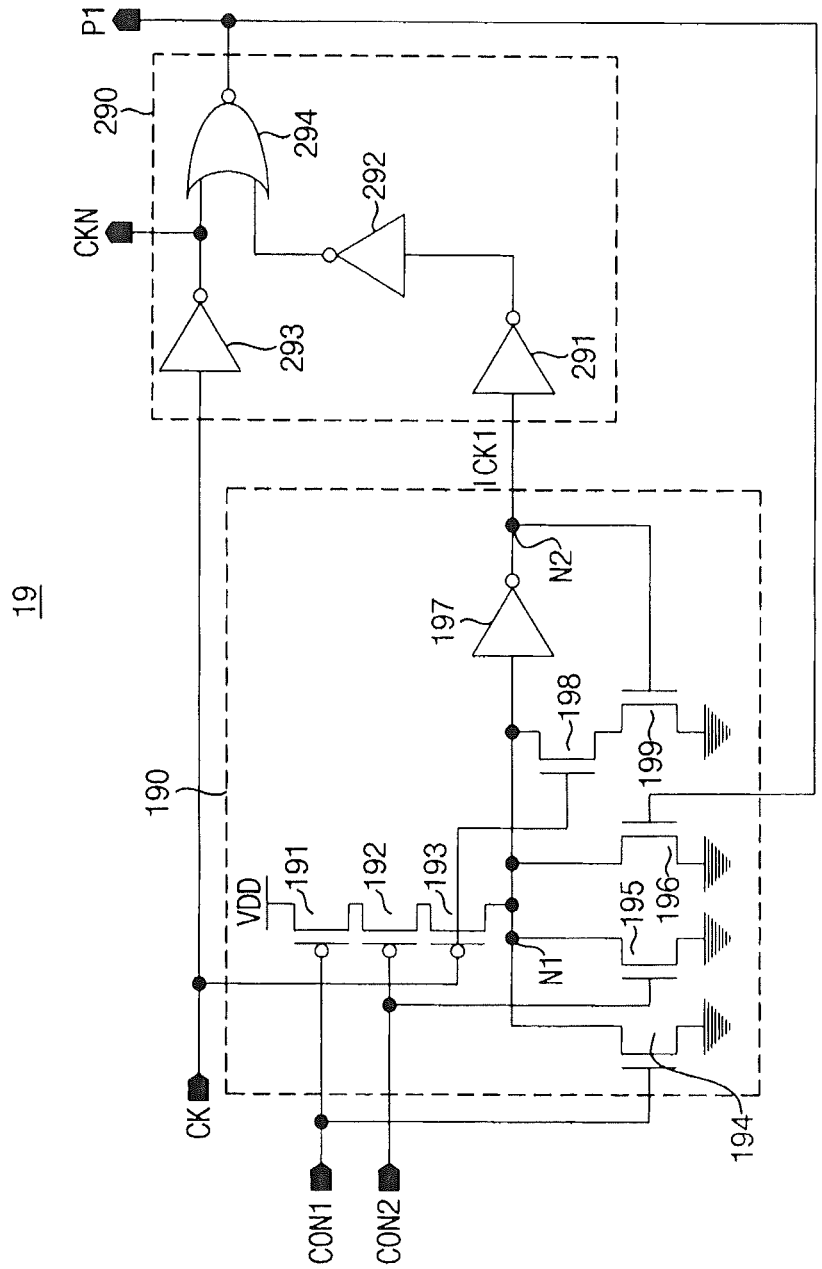
FIG. 10 is a circuit diagram illustrating another example of the pulse generator of FIG. 1 according to some embodiments.

FIG. 10 is a circuit diagram illustrating another example of the pulse generator of FIG. 1 according to some embodiments.

Referring to FIG. 10, a pulse generator 19 includes an internal clock generator circuit 190 and a pulse generator circuit 290.

The internal clock generator circuit 190 includes PMOS transistors 191, 192 and 193, NMOS transistors 194, 195 and 196, an inverter circuit 197, and NMOS transistors 198 and 199. The PMOS transistors 191, 192 and 193 are cascode-connected between the power supply voltage VDD and the first node N1. The PMOS transistor 191 has a gate receiving a first control signal CON1, the PMOS transistor 192 has a gate receiving a second control signal CON2 and the PMOS transistor 193 has a gate receiving the clock signal CK. The NMOS transistors 194, 195 and 196 are connected in parallel between the first node N1 and the ground. The NMOS transistor 194 has a gate receiving the first control signal CON1, the NMOS transistor 195 has a gate receiving the second control signal CON2 and the NMOS transistor 196 has a gate receiving the first pulse signal P1. The NMOS transistors 198 and 199 are cascode-connected between the first node N1 and the ground in parallel with the NMOS transistor 196. The NMOS transistor 198 is connected between the first node N1 and the NMOS transistor 199 and has a gate receiving the clock signal CK. The NMOS transistor 199 is connected between the NMOS transistor 198 and the ground and has a gate receiving the internal clock signal ICK1. The gate of the NMOS transistor 199 is connected to the second node N2. The inverter circuit 197 inverts a logic level of the first node N1 to provide the internal clock signal ICK1 at the second node N2.

The pulse generator circuit 290 includes inverter circuits 291, 292 and 293 and a NOR gate 294. The inverter circuit 291 inverts the internal clock signal ICK1. The inverter circuit 292 inverts an output of the inverter circuit 291. The inverter circuit 293 inverts the clock signal CK to provide an inverted clock signal CKN. The NOR gate 294 performs a NOR operation on the inverted clock signal CKN and an output of the inverter circuit 292 to provide the first pulse signal P1. The first pulse signal P1 is provided to the gate of the NMOS transistor 196 in the internal clock generator circuit 190.

Hereinafter, there will be description on operation of the pulse generator 19.

When both of the first and second control signals CON1 and CON2 are low level, the PMOS transistors 191 and 192 are turned on and the NMOS transistors 194 and 195 are turned off. Therefore, architecture of the pulse generator 19 is substantially the same as architecture of the pulse generator 14 of FIG. 5, and thus operation of the pulse generator 19 will not be repeated.

When at least one of the first and second control signals CON1 and CON2 is high level, at least one of the NMOS transistors 194 and 195 are turned on and the first node N1 is discharged to a level of the ground. When the first node N1 is discharged to a level of the ground, the internal clock signal ICK1 transitions to a high level and the output of the inverter circuit 291 transitions to a low level. When the output of the inverter circuit 291 transitions to a low level, the second pulse signal P2 transitions to a high level and the first pulse signal P1 is deactivated with a low level. That is, when at least one of the first and second control signals CON1 and CON2 is high level, the first pulse signal P1 is deactivated with a low level without regard to logic level of the clock signal CK. That is, the pulse generator 19 of FIG. 10 may control activating interval (pulse width) of the first pulse signal P1 by the first and second control signals CON1 and CON2.

Figure 11:
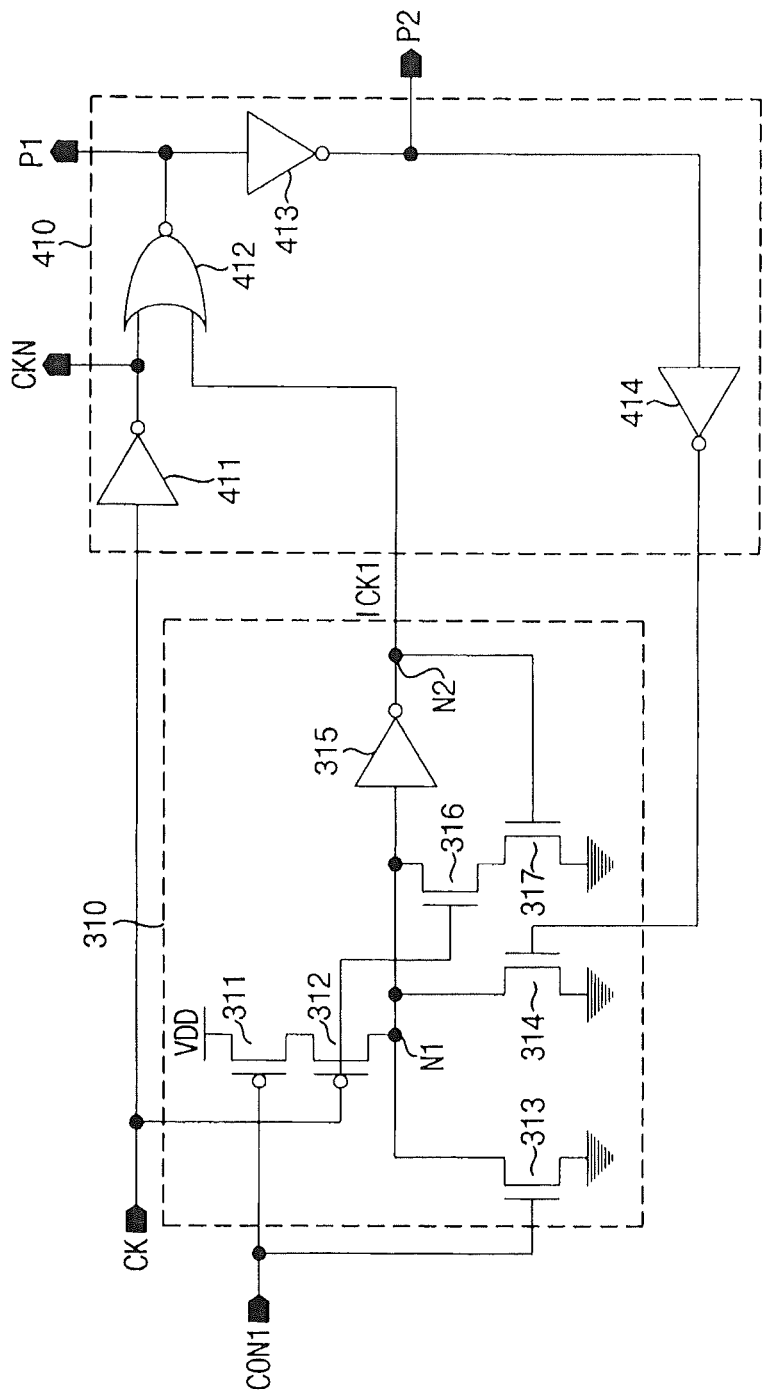
FIG. 11 is a circuit diagram illustrating another example of the pulse generator of FIG. 1 according to some embodiments.

FIG. 11 is a circuit diagram illustrating another example of the pulse generator of FIG. 1 according to some embodiments.

Referring to FIG. 11, a pulse generator 21 includes an internal clock generator circuit 310 and a pulse generator circuit 410.

The internal clock generator circuit 310 includes PMOS transistors 311 and 312, NMOS transistors 313 and 314, an inverter circuit 315, and NMOS transistors 316 and 317. The PMOS transistors 311 and 312 are connected between the power supply voltage VDD and the first node N1. The PMOS transistor 311 has a gate receiving a first control signal CON1, and the PMOS transistor 312 has a gate receiving the clock signal CK. The NMOS transistors 313 and 314 are connected in parallel between the first node N1 and the ground. The NMOS transistor 313 has a gate receiving the first control signal CON1 and the NMOS transistor 314 has a gate receiving the first pulse signal P1. The NMOS transistors 316 and 317 are cascode-connected between the first node N1 and the ground in parallel with the NMOS transistor 314. The NMOS transistor 316 is connected between the first node N1 and the NMOS transistor 317 and has a gate receiving the clock signal CK. The NMOS transistor 317 is connected between the NMOS transistor 316 and the ground and has a gate receiving the internal clock signal ICK1. The gate of the NMOS transistor 317 is connected to the second node N2. The inverter circuit 315 inverts a logic level of the first node N1 to provide the internal clock signal ICK1 at the second node N2.

The pulse generator circuit 410 includes an inverter circuit 411, a NOR gate 412 and inverter circuits 413 and 414. The inverter circuit 411 inverts the clock signal CK to provide an inverted clock signal CKN. The NOR gate 412 performs a NOR operation on the inverted clock signal CKN and the internal clock signal ICK1 to provide the first pulse signal P1. The inverter circuit 413 inverts the first pulse signal P1 to provide the second pulse signal P2. The inverter circuit 414 inverts the second pulse signal P2 to provide a delayed first pulse signal. The delayed first pulse signal is provided to the gate of the NMOS transistor 314 in the internal clock generator circuit 310.

Hereinafter, there will be description on operation of the pulse generator 21.

When the first control signal CON1 is a low level, the PMOS transistor 311 is turned on and the NMOS transistor 313 is turned off. Therefore, architecture of the pulse generator 21 is substantially the same as architecture of the pulse generator 15 of FIG. 6, and thus operation of the pulse generator 21 will not be repeated.

When the first control signal CON1 is a high level, the PMOS transistor 311 is turned off and the NMOS transistor 313 is turned on. When the NMOS transistor 313 is turned on, the first node N1 is discharged to a level of the ground. When the first node N1 is discharged to a level of the ground, the internal clock signal ICK1 transitions to a high level and the output of the inverter circuit 411 transitions to a low level. When the output of the inverter circuit 411 is low level, the first pulse signal P1, output of the NOR gate 412, is deactivated with a low level without regard to logic level of the clock signal CK. That is, the pulse generator 21 of FIG. 11 may control activating interval (or pulse width) of the first pulse signal P1 by the first control signal CON1.

Figure 12:
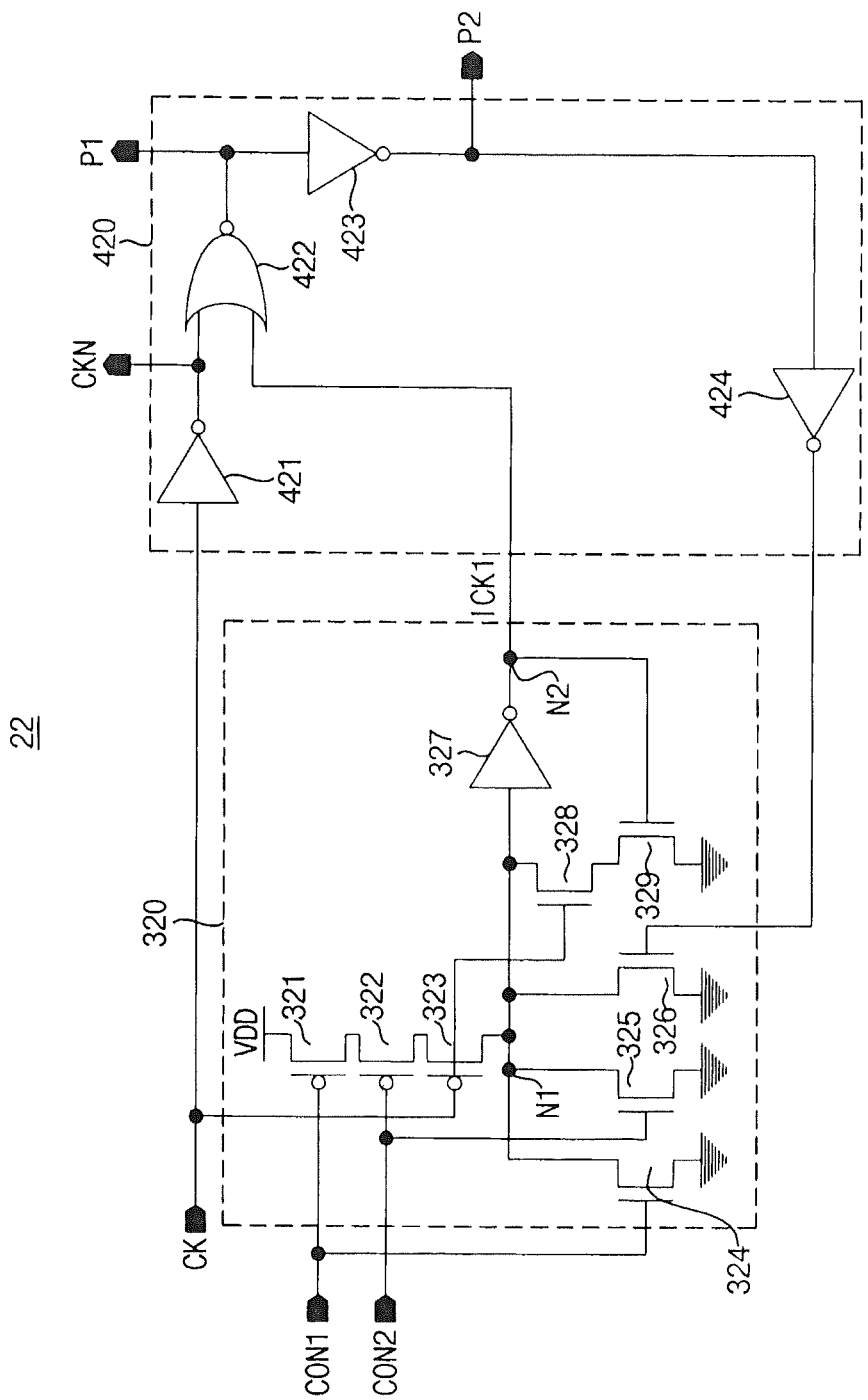
FIG. 12 is a circuit diagram illustrating another example of the pulse generator of FIG. 1 according to some embodiments.

FIG. 12 is a circuit diagram illustrating another example of the pulse generator of FIG. 1 according to some embodiments, Referring to FIG. 12, a pulse generator 22 includes an internal clock generator circuit 320 and a pulse generator circuit 420.

The internal clock generator circuit 320 includes PMOS transistors 321, 322 and 323, NMOS transistors 324, 325 and 326, an inverter circuit 327, and NMOS transistors 328 and 329. The PMOS transistors 321, 322 and 323 are cascode-connected between the power supply voltage VDD and the first node N1. The PMOS transistor 321 has a gate receiving a first control signal CON1, the PMOS transistor 322 has a gate receiving a second control signal CON2 and the PMOS transistor 323 has a gate receiving the clock signal CK. The NMOS transistors 324, 325 and 326 are connected in parallel between the first node N1 and the ground. The NMOS transistor 324 has a gate receiving the first control signal CON1, the NMOS transistor 325 has a gate receiving the second control signal CON2 and the NMOS transistor 326 has a gate receiving the first pulse signal P1. The NMOS transistors 328 and 329 are cascode-connected between the first node N1 and the ground in parallel with the NMOS transistor 326. The NMOS transistor 328 is connected between the first node N1 and the NMOS transistor 329 and has a gate receiving the clock signal CK. The NMOS transistor 329 is connected between the NMOS transistor 328 and the ground and has a gate receiving the internal clock signal ICK1. The gate of the NMOS transistor 329 is connected to the second node N2.

The inverter circuit 327 inverts a logic level of the first node N1 to provide the internal clock signal ICK1 at the second node N2.

The pulse generator circuit 420 includes an inverter circuit 421, a NOR gate 422 and inverter circuits 423 and 424. The inverter circuit 421 inverts the clock signal CK to provide an inverted clock signal CKN. The NOR gate 422 performs a NOR operation on the inverted clock signal CKN and the internal clock signal ICK1 to provide the first pulse signal P1. The inverter circuit 423 inverts the first pulse signal P1 to provide the second pulse signal P2. The inverter circuit 424 inverts the second pulse signal P2 to provide a delayed first pulse signal. The delayed first pulse signal is provided to the gate of the NMOS transistor 326 in the internal clock generator circuit 320.

Hereinafter, there will be description on operation of the pulse generator 22.

When both of the first and second control signals CON1 and CON2 are low level, the PMOS transistors 321 and 322 are turned on and the NMOS transistors 324 and 325 are turned off. Therefore, architecture of the pulse generator 22 is substantially the same as architecture of the pulse generator 15 of FIG. 6, and thus operation of the pulse generator 22 will not be repeated.

When at least one of the first and second control signals CON1 and CON2 is high level, at least one of the NMOS transistors 324 and 325 are turned on and the first node N1 is discharged to a level of the ground. When the first node N1 is discharged to a level of the ground, the internal clock signal ICK1 transitions to a high level and the output of the inverter circuit 327 transitions to a low level. When the output of the inverter circuit 327 transitions to a low level, the first pulse signal P1, output of the NOR gate 422 is deactivated with a low level without regard to logic level of the clock signal CK. That is, the pulse generator 22 of FIG. 12 may control activating interval (pulse width) of the first pulse signal P1 by the first and second control signals CON1 and CON2.

Figure 13:
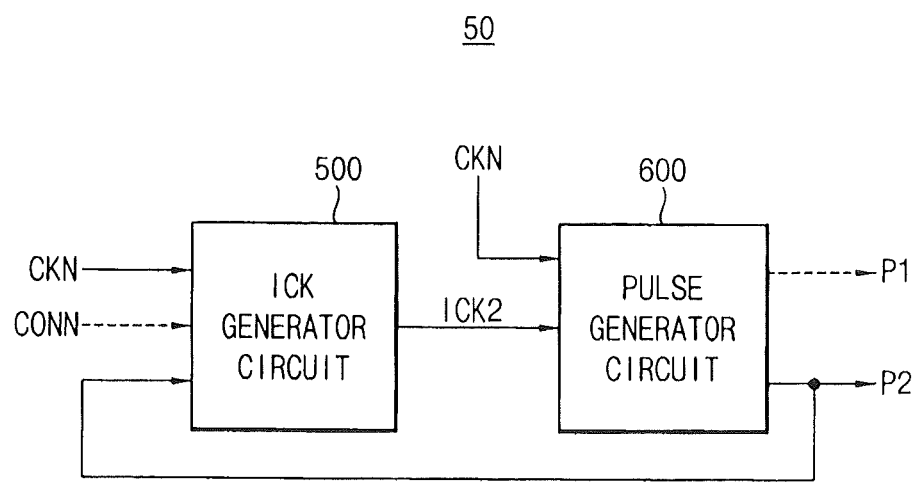
FIG. 13 is a block diagram illustrating a pulse generator according to some embodiments.

FIG. 13 is a block diagram illustrating a pulse generator according to some embodiments. The pulse generator 50 includes an internal clock generator circuit 500 and a pulse generator circuit 600. It will be appreciated that the internal clock generator circuit 500 and the pulse generator circuit 600 may be included in an integrated circuit device, The internal clock generator circuit 500 may receive an inverted clock signal CKN and a second pulse signal P2 to generate an internal clock signal ICK2. The pulse generator circuit 600 may generate at least the second pulse signal P2 based on the inverted clock signal CKN and the internal clock signal ICK2. The pulse generator circuit 600 receives the inverted clock signal CKN and the internal clock signal ICK2 which is in synchronization with the inverted clock signal CKN with some delay to generate at least the second pulse signal P2 which is in synchronization with a falling edge of the inverted clock signal CKN with some delay. The internal clock generator circuit 500 delays the second pulse signal P2 to generate the internal clock signal ICK2 that determines a pulse width of the second pulse signal P1, based on at least the inverted clock signal CKN and the second pulse signal P2. The internal clock generator circuit 500 may generate the internal clock signal ICK2 based on the inverted clock signal CKN, a control signal CONN and the second pulse signal P2. The pulse generator circuit 600 may generate the second pulse signal P2 and a first pulse signal P1 based on the inverted clock signal CKN and the internal clock signal ICK2. The first pulse signal P1 has a phase inverse to a phase of the second pulse signal P2. That is, the first and second pulse signals P1 and P2 have a phase difference of 180 degrees. In addition, the control signal CONN may have a phase inverse to a phase of the control signal CON in FIG. 1. Therefore, the pulse generator 50 may include the pulse generator 10 of FIG. 1 and an inverter circuit (not illustrated) that inverts the clock signal CK and the control signal CON to provide the inverted clock signal CKN and the control signal CONN.

Figure 14:
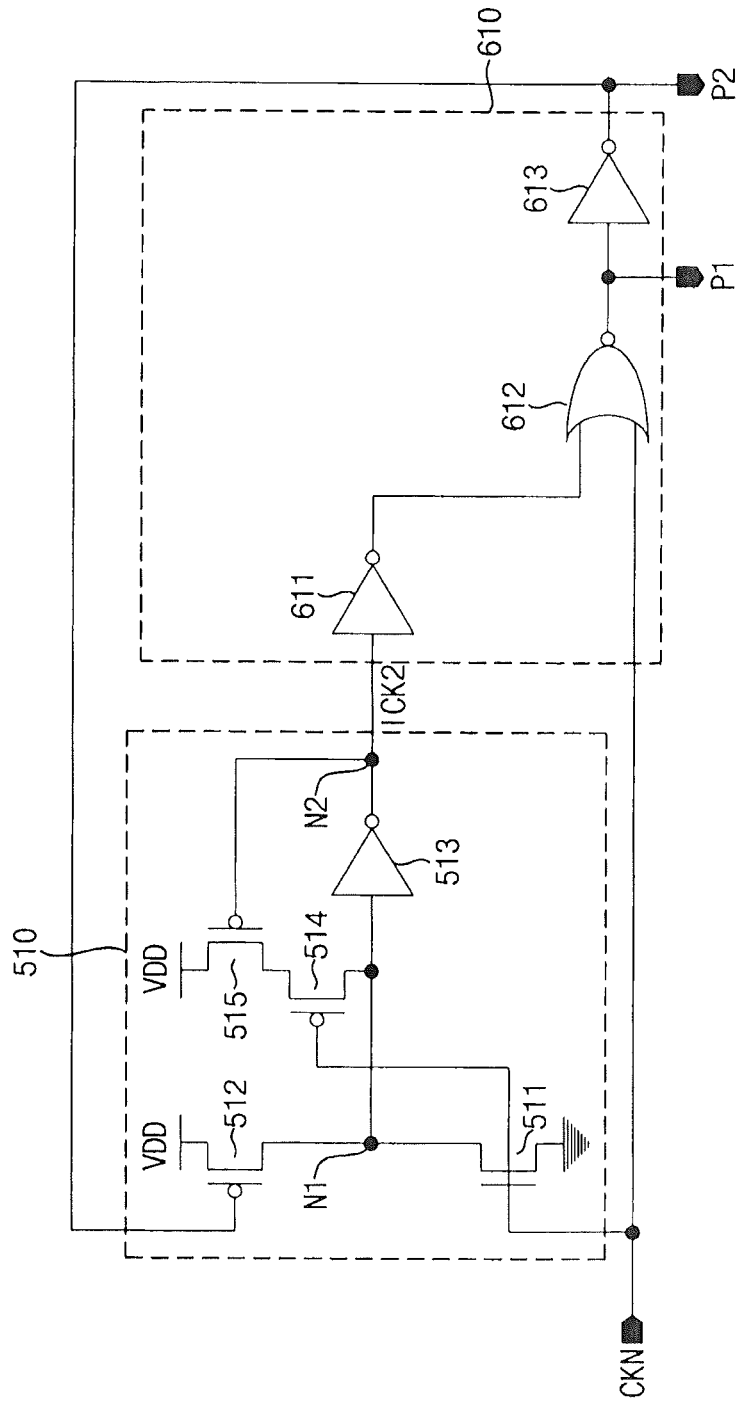
FIG. 14 is a circuit diagram illustrating an example of the pulse generator of FIG. 13 according to some embodiments.

FIG. 14 is a circuit diagram illustrating an example of the pulse generator of FIG. 13 according to some embodiments.

Referring to FIG. 14, a pulse generator 51 includes an internal clock generator circuit 510 and a pulse generator circuit 610.

The internal clock generator circuit 510 includes NMOS transistor 511, PMOS transistor 512, an inverter circuit 513 and PMOS transistors 514 and 515. The NMOS transistor 511 has a source connected to a ground, a drain connected to a first node N1 and a gate receiving the inverted clock signal CKN. The PMOS transistor 512 has a source connected to a power supply voltage VDD, a drain connected to the first node N1 and a gate receiving the second pulse signal P2. The PMOS transistors 514 and 515 are connected between the first node N1 and the power supply voltage VDD in parallel with the PMOS transistor 512. The PMOS transistor 514 is connected between the first node N1 and the PMOS transistor 515 and has a gate receiving the inverted clock signal CKN. The PMOS transistor 515 is connected between the PMOS transistor 514 and the power supply voltage VDD and has a gate receiving the internal clock signal ICK2. The gate of the PMOS transistor 515 is connected to a second node N2. The inverter circuit 513 inverts a logic level of the first node N1 to provide the internal clock signal ICK2 at the second node N2.

The pulse generator circuit 610 includes an inverter circuit 611, a NOR gate 612 and an inverter circuit 613. The inverter circuit 611 inverts the internal clock signal ICK2. The NOR gate 612 performs a NOR operation on the inverted clock signal CKN and an output of the inverter circuit 611 to provide the first pulse signal P1. The inverter circuit 613 inverts the first pulse signal P1 to provide the second pulse signal P2. The second pulse signal P2 is provided to the gate of the PMOS transistor 512 in the internal clock generator circuit 510.

Hereinafter, there will be description on operation of the pulse generator 51.

When the inverted clock signal CKN transitions from a high level to a low level, the first pulse signal P1, output of the NOR gate 612, transitions from a low level to a high level, in synchronization with a falling edge of the inverted clock signal CKN with some delay. When the first pulse signal P1 transitions from a low level to a high level, in synchronization with a falling edge of the inverted clock signal CKN with some delay, the second pulse signal P2, output of the inverter circuit 613, transitions from a high level to a low level, in synchronization with a falling edge of the inverted clock signal CKN with some delay. When the second pulse signal P2 transitions from a high level to a low level, in synchronization with a falling edge of the inverted clock signal CKN with some delay, the PMOS transistor 512 is turned on, and the first node N1 is precharged to a level of the power supply voltage VDD. When the first node N1 is precharged to a level of the power supply voltage VDD, the internal clock signal ICK2 at the second node N2 transitions from a high level to a low level. When the internal clock signal ICK2 at the second node N2 transitions from a high level to a low level, the output of the inverter circuit 611 transitions from a low level to a high level. When the output of the inverter circuit 611 transitions from a low level to a high level, the first pulse signal P1 transitions from a high level to a low level in response to the output of the inverter circuit 611 transitioning to a high level.

When the first pulse signal P1 transitions from a high level to a low level, the second pulse signal P2 transitions from a low level to a high level. That is, the second pulse signal P2 transitions to a high level in synchronization with a falling edge of the internal clock signal ICK2 with some delay, a pulse width of the second pulse signal P2 may be determined in response to the falling edge of the internal clock signal ICK2. In addition, the second pulse signal P2 is deactivated in response to a falling edge of the inverted clock signal CKN and is activated through five propagation delays including the NOR gate 612, the inverter circuit 613, the PMOS transistor 512, and the inverter circuits 513 and 611 and the NOR gate 612 and the inverter circuit 613.

Figure 15:
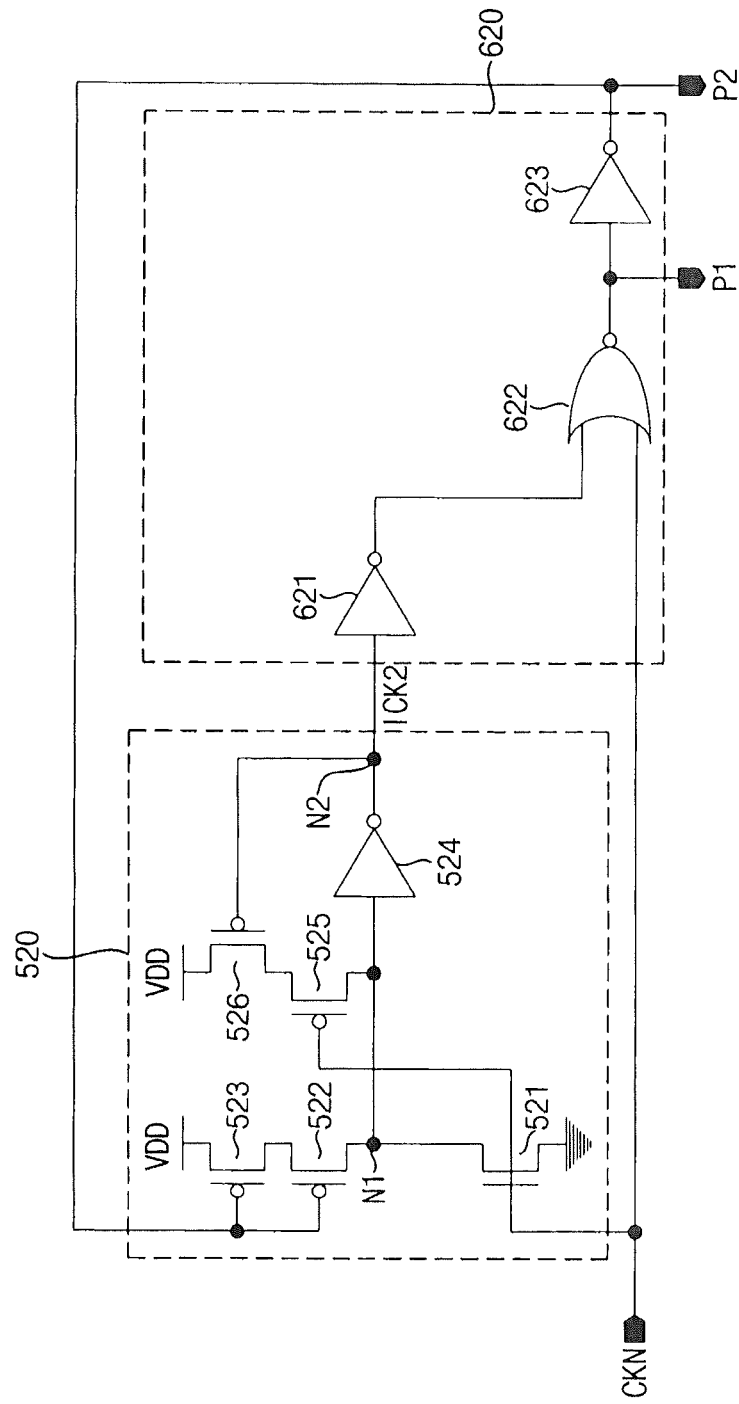
FIG. 15 is a circuit diagram illustrating another example of the pulse generator of FIG. 13 according to some embodiments.

FIG. 15 is a circuit diagram illustrating another example of the pulse generator of FIG. 13 according to some embodiments.

Referring to FIG. 15, a pulse generator 52 includes an internal clock generator circuit 520 and a pulse generator circuit 620.

The internal clock generator circuit 520 includes a NMOS transistor 521, PMOS transistors 522 and 523, an inverter circuit 524, and PMOS transistors 525 and 526. The NMOS transistor 521 has a source connected to the ground, a drain connected to the first node N1 and a gate receiving the inverted clock signal CKN. The PMOS transistors 522 and 523 are cascode-connected between the first node N1 and the power supply voltage VDD. The PMOS transistor 522 is connected between the first node N1 and the PMOS transistor 523 and has a gate receiving the second pulse signal P2. The PMOS transistor 523 is connected between the PMOS transistor 522 and the power supply voltage VDD and has a gate receiving the second pulse signal P2. The PMOS transistors 525 and 526 are connected between the first node N1 and the power supply voltage VDD in parallel with the PMOS transistors 522 and 523. The PMOS transistor 525 is connected between the first node N1 and the PMOS transistor 526 and has a gate receiving the inverted clock signal CKN. The PMOS transistor 526 is connected between the PMOS transistor 525 and the power supply voltage VDD and has a gate receiving the internal clock signal ICK2. The gate of the PMOS transistor 526 is connected to a second node N2. The inverter circuit 524 inverts a logic level of the first node N1 to provide the internal clock signal ICK2 at the second node N2.

The pulse generator circuit 620 includes an inverter circuit 621, a NOR gate 622 and an inverter circuit 623. The inverter circuit 621 inverts the internal clock signal ICK2. The NOR gate 622 performs a NOR operation on the inverted clock signal CKN and an output of the inverter circuit 621 to provide the first pulse signal Pl. The inverter circuit 623 inverts the first pulse signal P1 to provide the second pulse signal P2. The second pulse signal P2 is provided to the gate of the PMOS transistor 523 in the internal clock generator circuit 520.

The pulse generator 52 differs from the pulse generator 51 in that the PMOS transistors 522 and 523 replace the PMOS transistor 512. The PMOS transistors 522 and 523 may more capacitance and resistance than the PMOS transistor 512, and thus may provide more delay than the PMOS transistor 512. Therefore, the pulse width of the pulse generator 52 of FIG. 15 may be wider than that of the pulse generator 51 of FIG. 14. Other operation of the pulse generator 52 is substantially similar to operation of the pulse generator 51, and thus, detailed description on operation of the pulse generator 52 will not be repeated.

Figure 16:
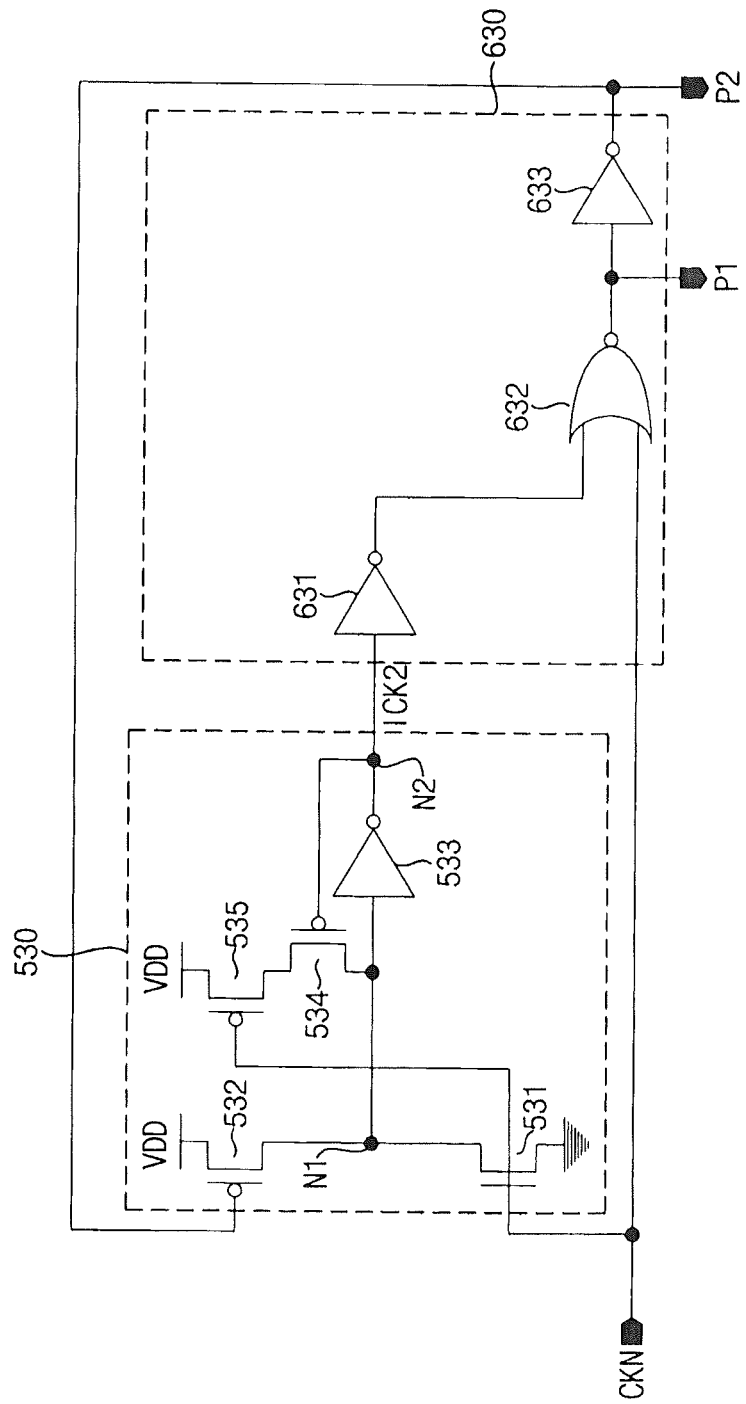
FIG. 16 is a circuit diagram illustrating another example of the pulse generator of FIG. 13 according to some embodiments.

FIG. 16 is a circuit diagram illustrating another example of the pulse generator of FIG. 13 according to some embodiments.

Referring to FIG. 16, a pulse generator 53 includes an internal clock generator circuit 530 and a pulse generator circuit 630.

The internal clock generator circuit 530 includes a NMOS transistor 531, PMOS transistor 532, an inverter circuit 533, and PMOS transistors 534 and 535. The NMOS transistor 531 has a source connected to the ground, a drain connected to the first node N1 and a gate receiving the inverted clock signal CKN. The PMOS transistor 532 is connected between the first node N1 and the power supply voltage VDD. The PMOS has a gate receiving the second pulse signal P2. The PMOS transistors 334 and 335 are connected between the first node N1 and the power supply voltage VDD in parallel with the PMOS transistor 532. The PMOS transistor 534 is connected between the first node N1 and the PMOS transistor 534 and has a gate receiving the internal clock signal ICK2. The gate of the NMOS transistor 534 is connected to the second node N2. The PMOS transistor 535 is connected between the PMOS transistor 534 and the power supply voltage VDD and has a gate receiving the inverted clock signal CKN. The inverter circuit 533 inverts a logic level of the first node N1 to provide the internal clock signal ICK2 at the second node N2.

The pulse generator circuit 630 includes an inverter circuit 631, a NOR gate 632 and an inverter circuit 633. The inverter circuit 631 inverts the internal clock signal ICK2. The NOR gate 632 performs a NOR operation on the inverted clock signal CKN and an output of the inverter circuit 631 to provide the first pulse signal P1. The inverter circuit 633 inverts the first pulse signal P1 to provide the second pulse signal P2. The second pulse signal P2 is provided to the gate of the PMOS transistor 532 in the internal clock generator circuit 530.

The pulse generator 53 of FIG. 16 differs from the pulse generator 51 of FIG. 14 in that the PMOS transistor 534 has the gate receiving the internal clock signal ICK2 and the PMOS transistor 535 has the gate receiving the inverted clock signal CKN in the pulse generator 52 of FIG. 16 while the PMOS transistor 514 has the gate receiving the inverted clock signal CKN and the PMOS transistor 515 has the gate receiving the internal clock signal ICK2 in the pulse generator 51 of FIG. 14. Other operation of the pulse generator 53 is substantially similar to operation of the pulse generator 51, and thus, detailed description on operation of the pulse generator 53 will not be repeated.

Figure 17:
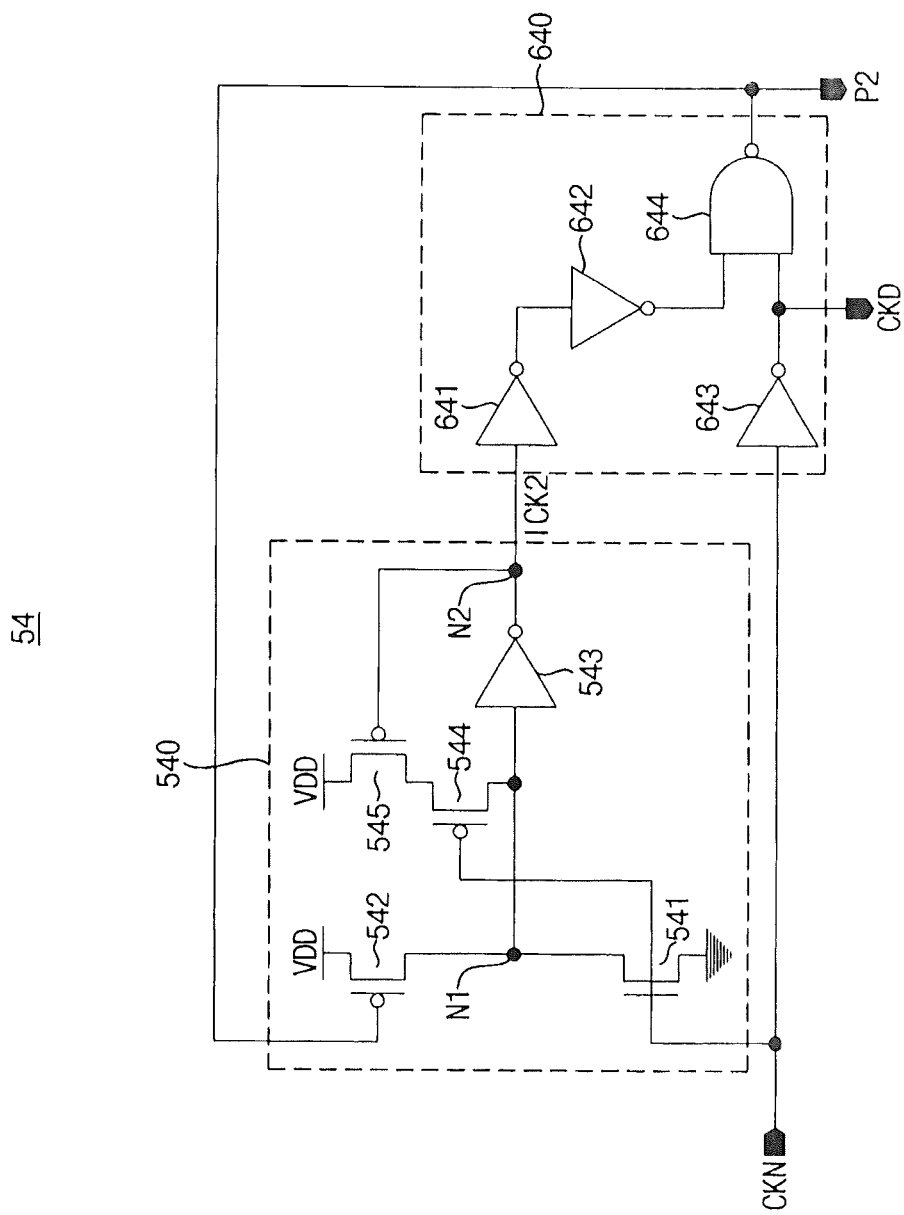
FIG. 17 is a circuit diagram illustrating an example of the pulse generator of FIG. 13 according to some embodiments.

FIG. 17 is a circuit diagram illustrating an example of the pulse generator of FIG. 13 according to some embodiments.

Referring to FIG. 17, a pulse generator 54 includes an internal clock generator circuit 540 and a pulse generator circuit 640, The internal clock generator circuit 540 includes NMOS transistor 541, PMOS transistor 542, an inverter circuit 543 and PMOS transistors 544 and 545. The NMOS transistor 541 has a source connected to a ground, a drain connected to a first node N1 and a gate receiving the inverted clock signal CKN. The PMOS transistor 542 has a source connected to a power supply voltage VDD, a drain connected to the first node N1 and a gate receiving the second pulse signal P2. The PMOS transistors 544 and 545 are connected between the first node N1 and the power supply voltage VDD in parallel with the PMOS transistor 542. The PMOS transistor 544 is connected between the first node N1 and the PMOS transistor 545 and has a gate receiving the inverted clock signal CKN. The PMOS transistor 545 is connected between the PMOS transistor 544 and the power supply voltage VDD and has a gate receiving the internal clock signal ICK2. The gate of the PMOS transistor 545 is connected to a second node N2. The inverter circuit 543 inverts a logic level of the first node N1 to provide the internal clock signal ICK2 at the second node N2.

The pulse generator circuit 640 includes inverter circuits 641, 642 and 643 and a NAND gate 644. The inverter circuit 641 inverts the internal clock signal ICK2. The inverter circuit 642 inverts an output of the inverter circuit 641. The inverter circuit 643 inverts the inverted clock signal CKN to provide a delayed clock signal CKD. The NAND gate 644 performs a NAND operation on the delayed clock signal CKD and an output of the inverter circuit 642 to provide the second pulse signal P2. The second pulse signal P2 is provided to the gate of the PMOS transistor 542 in the internal clock generator circuit 540.

The pulse generator 54 of FIG. 17 differs from the pulse generator 51 of FIG. 14 in that the pulse generator circuit 540 differs from the pulse generator circuit 510. The pulse generator circuit 540 is substantially an equivalent to the pulse generator circuit 510. Therefore, detailed description on operation of the pulse generator 54 will not be repeated.

Figure 18:
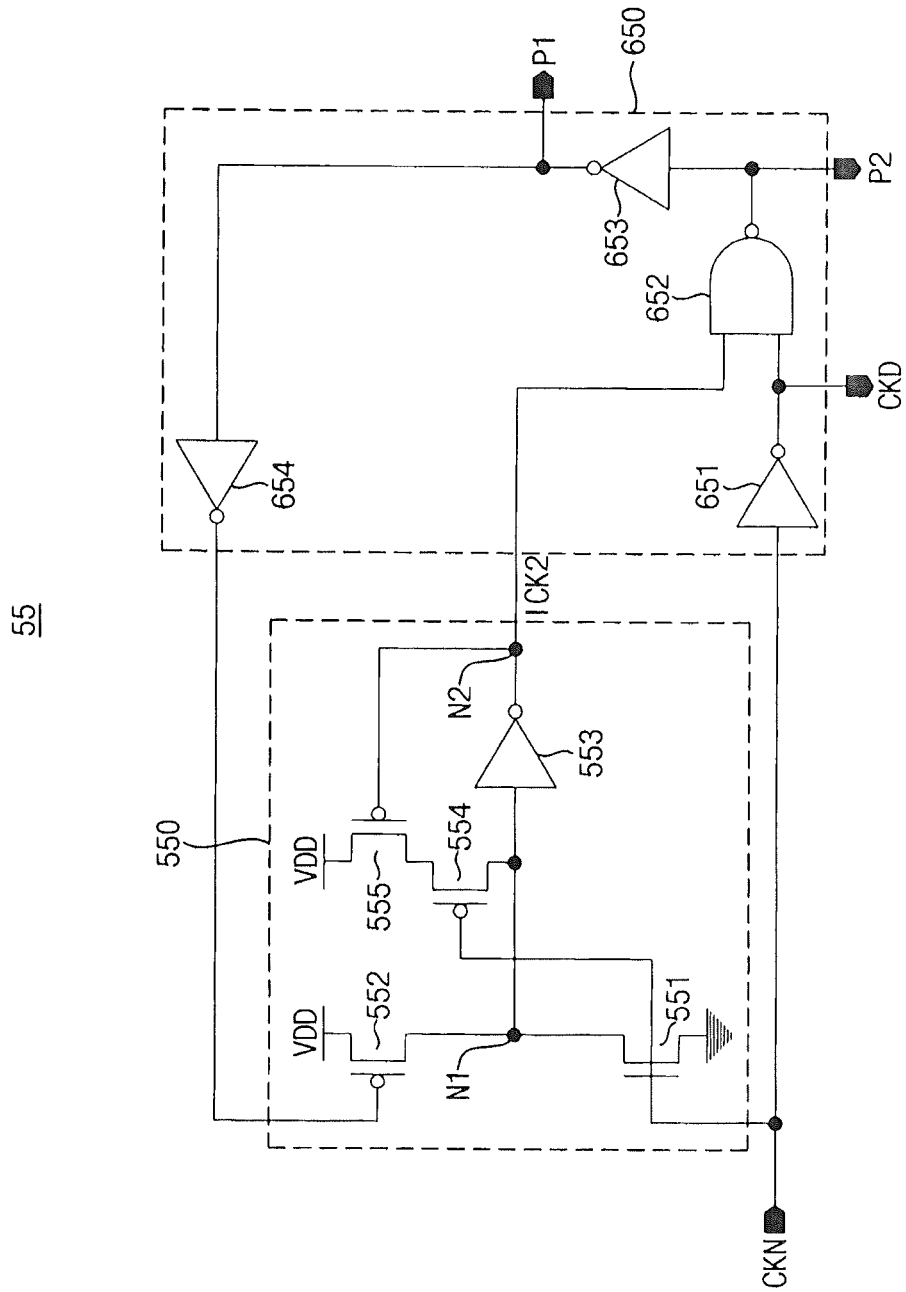
FIG. 18 is a circuit diagram illustrating an example of the pulse generator of FIG. 13 according to some embodiments.

FIG. 18 is a circuit diagram illustrating an example of the pulse generator of FIG. 13 according to some embodiments.

Referring to FIG. 18, a pulse generator 55 includes an internal clock generator circuit 550 and a pulse generator circuit 650.

The internal clock generator circuit 550 includes NMOS transistor 551, PMOS transistor 552, an inverter circuit 553 and PMOS transistors 554 and 555. The NMOS transistor 551 has a source connected to a ground, a drain connected to a first node N1 and a gate receiving the inverted clock signal CKN. The PMOS transistor 552 has a source connected to a power supply voltage VDD, a drain connected to the first node N1 and a gate receiving the second pulse signal P2. The PMOS transistors 554 and 555 are connected between the first node N1 and the power supply voltage VDD in parallel with the PMOS transistor 552. The PMOS transistor 554 is connected between the first node N1 and the PMOS transistor 555 and has a gate receiving the inverted clock signal CKN. The PMOS transistor 555 is connected between the PMOS transistor 554 and the power supply voltage VDD and has a gate receiving the internal clock signal ICK2. The gate of the PMOS transistor 555 is connected to a second node N2. The inverter circuit 553 inverts a logic level of the first node N1 to provide the internal clock signal ICK2 at the second node N2.

The pulse generator circuit 550 includes an inverter circuit 551, a NAND gate 552 and inverter circuits 553 and 554. The inverter circuit 551 inverts the inverted clock signal CKN to provide a delayed clock signal CKD. The NAND gate 652 performs a NAND operation on the delayed clock signal CKD and the internal clock signal ICK2 to provide the second pulse signal P2. The inverter circuit 653 inverts the second pulse signal P2 to provide the first pulse signal P1. The inverter circuit 654 inverts the first pulse signal P1 to provide a delayed second pulse signal. The delayed second pulse signal is provided to the gate of the PMOS transistor 552 in the internal clock generator circuit 550.

The pulse generator 55 of FIG. 18 differs from the pulse generator 51 of FIG. 14 in that the pulse generator circuit 650 differs from the pulse generator circuit 610. The pulse generator circuit 650 is substantially an equivalent to the pulse generator circuit 610. Therefore, detailed description on operation of the pulse generator 55 will not be repeated.

Figure 19:
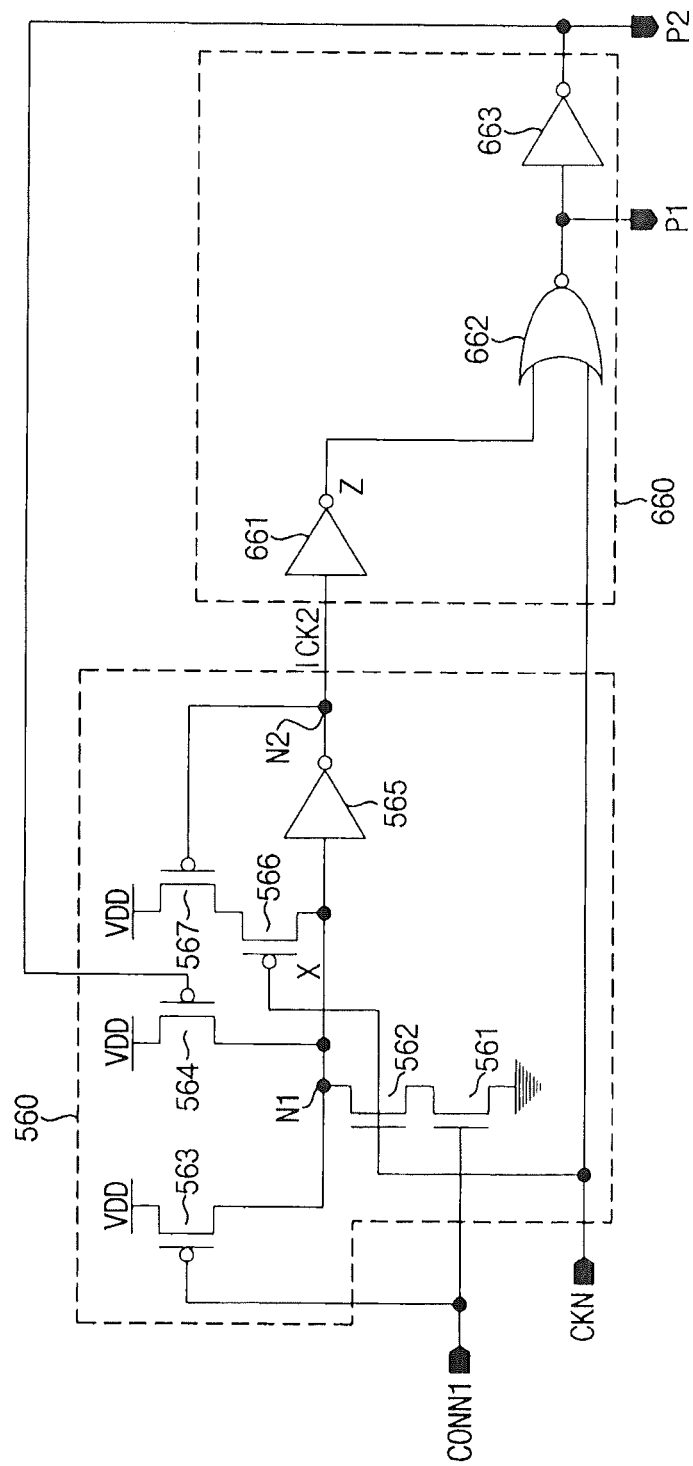
FIG. 19 is a circuit diagram illustrating another example of the pulse generator of FIG. 13 according to some embodiments.

FIG. 19 is a circuit diagram illustrating another example of the pulse generator of FIG. 13 according to some embodiments.

Referring to FIG. 19, a pulse generator 56 includes an internal clock generator circuit 560 and a pulse generator circuit 660.

The internal clock generator circuit 560 includes NMOS transistors 561 and 562, PMOS transistors 563 and 564, an inverter circuit 565, and PMOS transistors 566 and 567. The NMOS transistors 561 and 562 are connected between the ground and the first node N1. The NMOS transistor 561 has a gate receiving a first control signal CONN1, and the NMOS transistor 562 has a gate receiving the inverted clock signal CKN. The PMOS transistors 563 and 564 are connected in parallel between the first node N1 and the power supply voltage VDD. The PMOS transistor 563 has a gate receiving the first control signal CONN1 and the PMOS transistor 564 has a gate receiving the second pulse signal P2. The PMOS transistors 566 and 567 are cascode-connected between the first node N1 and the power supply voltage VDD in parallel with the PMOS transistor 564. The PMOS transistor 566 is connected between the first node N1 and the PMOS transistor 567 and has a gate receiving the inverted clock signal CKN. The PMOS transistor 567 is connected between the PMOS transistor 566 and the power supply voltage VDD and has a gate receiving the internal clock signal ICK2. The gate of the PMOS transistor 567 is connected to the second node N2. The inverter circuit 565 inverts a logic level of the first node N1 to provide the internal clock signal ICK2 at the second node N2.

The pulse generator circuit 660 includes an inverter circuit 661, a NOR gate 662 and an inverter circuit 663. The inverter circuit 661 inverts the internal clock signal ICK2. The NOR gate 662 performs a NOR operation on the inverted clock signal CKN and an output of the inverter circuit 661 to provide the first pulse signal P1. The inverter circuit 663 inverts the first pulse signal P1 to provide the second pulse signal P2. The second pulse signal P2 is provided to the gate of the PMOS transistor 564 in the internal clock generator circuit 560.

Hereinafter, there will be description on operation of the pulse generator 56.

When the first control signal CONN1 is a high level, the NMOS transistor 561 is turned on and the PMOS transistor 563 is turned off. Therefore, architecture of the pulse generator 56 is substantially the same as architecture of the pulse generator 51 of FIG. 14. Therefore, description on operation of the pulse generator 56 will not be repeated.

When the first control signal CONN1 is a low level, the NMOS transistor 561 is turned off and the PMOS transistor 563 is turned on. When the PMOS transistor 563 is turned on, the first node N1 is precharged to a level of the power supply voltage VDD. When the first node N1 is precharged to a level of the power supply voltage VDD, the internal clock signal ICK2 transitions to a low level and the output of the inverter circuit 561 transitions to a high level. When the output of the inverter circuit 561 transitions to a high level, the first pulse signal P1 transitions to a low level and the second pulse signal P2 is activated with a high level. That is, when the first control signal CONN1 is a low level, the second pulse signal P2 is activated with a high level without regard to logic level of the inverted clock signal CKN. That is, the pulse generator 56 of FIG. 19 may control deactivating interval of the second pulse signal P2 by the first control signal CONN1.

Figure 20:
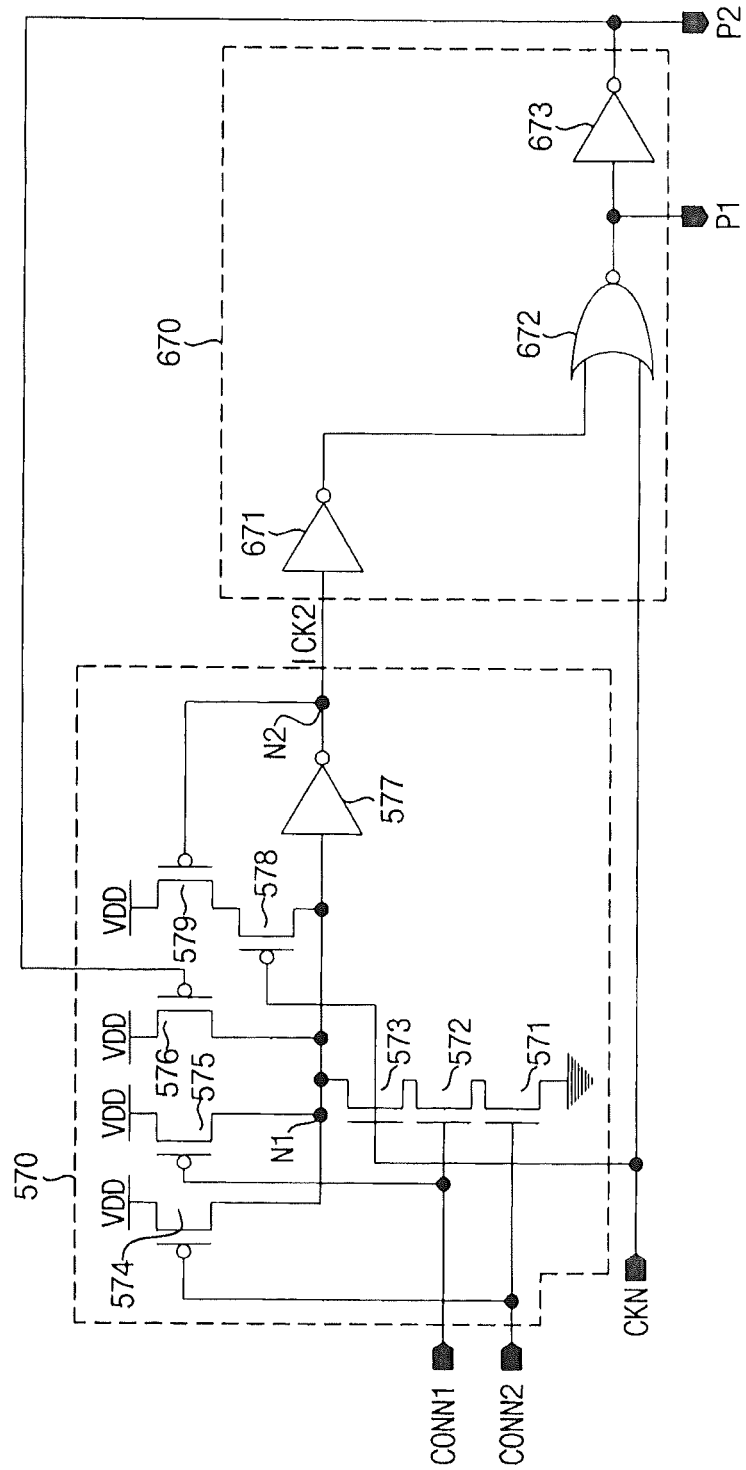
FIG. 20 is a circuit diagram illustrating another example of the pulse generator of FIG. 13 according to some embodiments.

FIG. 20 is a circuit diagram illustrating another example of the pulse generator of FIG. 13 according to some embodiments.

Referring to FIG. 20, a pulse generator 57 includes an internal clock generator circuit 570 and a pulse generator circuit 670.

The internal clock generator circuit 570 includes NMOS transistors 571, 572 and 573, PMOS transistors 574, 575 and 576, an inverter circuit 577, and PMOS transistors 578 and 579. The NMOS transistors 571, 572 and 573 are cascode-connected between the ground and the first node N1. The NMOS transistor 571 has a gate receiving a second control signal CONN2, the NMOS transistor 572 has a gate receiving a first control signal CONN1 and the NMOS transistor 573 has a gate receiving the inverted clock signal CKN. The PMOS transistors 574, 575 and 576 are connected in parallel between the first node N1 and the power supply voltage VDD. The PMOS transistor 574 has a gate receiving the second control signal CONN2, the PMOS transistor 575 has a gate receiving the first control signal CONN1 and the PMOS transistor 576 has a gate receiving the second pulse signal P2. The PMOS transistors 578 and 579 are cascode-connected between the first node N1 and the power supply voltage VDD in parallel with the PMOS transistor 576. The PMOS transistor 578 is connected between the first node N1 and the PMOS transistor 579 and has a gate receiving the inverted clock signal CKN. The PMOS transistor 579 is connected between the PMOS transistor 578 and the power supply voltage VDD and has a gate receiving the internal clock signal ICK2. The gate of the PMOS transistor 579 is connected to the second node N2. The inverter circuit 577 inverts a logic level of the first node N1 to provide the internal clock signal ICK2 at the second node N2.

The pulse generator circuit 670 includes an inverter circuit 671, a NOR gate 672 and an inverter circuit 673. The inverter circuit 671 inverts the internal clock signal ICK2. The NOR gate 672 performs a NOR operation on the inverted clock signal CKN and an output of the inverter circuit 671 to provide the first pulse signal P1. The inverter circuit 673 inverts the first pulse signal P1 to provide the second pulse signal P2. The second pulse signal P2 is provided to the gate of the PMOS transistor 576 in the internal clock generator circuit 570.

Hereinafter, there will be description on operation of the pulse generator 57,

When both of the first and second control signals CONN1 and CONN2 are high level, the NMOS transistors 571 and 572 are turned on and the PMOS transistors 574 and 575 are turned off. Therefore, architecture of the pulse generator 57 is substantially the same as architecture of the pulse generator 51 of FIG. 14, and thus operation of the pulse generator 57 will not be repeated.

When at least one of the first and second control signals CONN1 and CONN2 is low level, at least one of the PMOS transistors 574 and 575 are turned on and the first node N1 is precharged to a level of the power supply voltage VDD. When the first node N1 is precharged to a level of the power supply voltage VDD, the internal clock signal ICK2 transitions to a low level and the output of the inverter circuit 671 transitions to a high level. When the output of the inverter circuit 671 transitions to a high level, the first pulse signal P1 transitions to a low level and the second pulse signal P2 is activated with a high level. That is, when at least one of the first and second control signals CONN1 and CONN2 is low level, the second pulse signal P2 is activated with a high level without regard to logic level of the inverted clock signal CKN. That is, the pulse generator 57 of FIG. 20 may control deactivating interval of the second pulse signal P2 by the first and second control signals CONN1 and CONN2.

Figure 21:
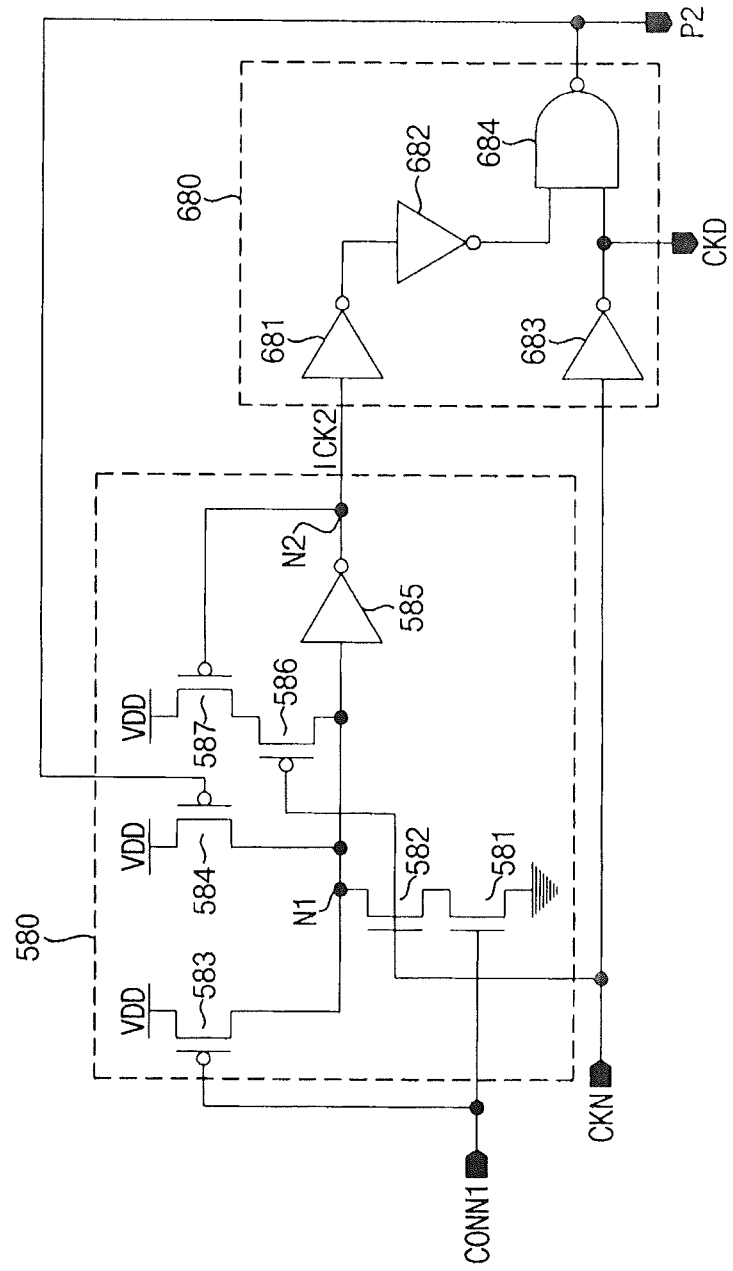
FIG. 21 is a circuit diagram illustrating another example of the pulse generator of FIG. 13 according to some embodiments.

FIG. 21 is a circuit diagram illustrating another example of the pulse generator of FIG. 13 according to some embodiments.

Referring to FIG. 21, a pulse generator 58 includes an internal clock generator circuit 580 and a pulse generator circuit 680.

The internal clock generator circuit 580 includes NMOS transistors 581 and 582, PMOS transistors 583 and 584, an inverter circuit 585, and PMOS transistors 586 and 587. The NMOS transistors 581 and 582 are connected between the ground and the first node N1. The NMOS transistor 581 has a gate receiving a first control signal CONN1, and the NMOS transistor 582 has a gate receiving the inverted clock signal CKN. The PMOS transistors 583 and 584 are connected in parallel between the first node N1 and the power supply voltage VDD. The PMOS transistor 583 has a gate receiving the first control signal CONN1 and the PMOS transistor 584 has a gate receiving the second pulse signal P2. The PMOS transistors 586 and 587 are cascode-connected between the first node N1 and the power supply voltage VDD in parallel with the PMOS transistor 584. The PMOS transistor 586 is connected between the first node N1 and the PMOS transistor 587 and has a gate receiving the inverted clock signal CKN. The PMOS transistor 587 is connected between the PMOS transistor 586 and the power supply voltage VDD and has a gate receiving the internal clock signal ICK2. The gate of the PMOS transistor 587 is connected to the second node N2. The inverter circuit 585 inverts a logic level of the first node N1 to provide the internal clock signal ICK2 at the second node N2.

The pulse generator circuit 680 includes inverter circuits 681, 682 and 683 and a NAND gate 684. The inverter circuit 681 inverts the internal clock signal ICK2. The inverter circuit 682 inverts an output of the inverter circuit 681. The inverter circuit 683 inverts the inverted clock signal CKN to provide a delayed clock signal CKD. The NAND gate 684 performs a NAND operation on the delayed clock signal CKD and an output of the inverter circuit 682 to provide the second pulse signal P2. The second pulse signal P2 is provided to the gate of the PMOS transistor 584 in the internal clock generator circuit 580.

Hereinafter, there will be description on operation of the pulse generator 58.

When the first control signal CONN1 is a high level, the NMOS transistor 581 is turned on and the PMOS transistor 583 is turned off. Therefore, architecture of the pulse generator 58 is substantially the same as architecture of the pulse generator 54 of FIG. 17, and thus operation of the pulse generator 58 will not be repeated.

When the first control signal CONN1 is a low level, the NMOS transistor 581 is turned off and the PMOS transistor 583 is turned on. When the PMOS transistor 583 is turned on, the first node N1 is precharged to a level of the power supply voltage VDD. When the first node N1 is precharged to a level of the power supply voltage VDD, the internal clock signal ICK2 transitions to a low level and the output of the inverter circuit 681 transitions to a high level. When the output of the inverter circuit 681 is high level, the second pulse signal P2, output of the NAND gate 684, is activated with a high level without regard to logic level of the inverted clock signal CKN. That is, the pulse generator 58 of FIG. 21 may control deactivating interval of the second pulse signal P2 by the first control signal CONN1.

Figure 22:
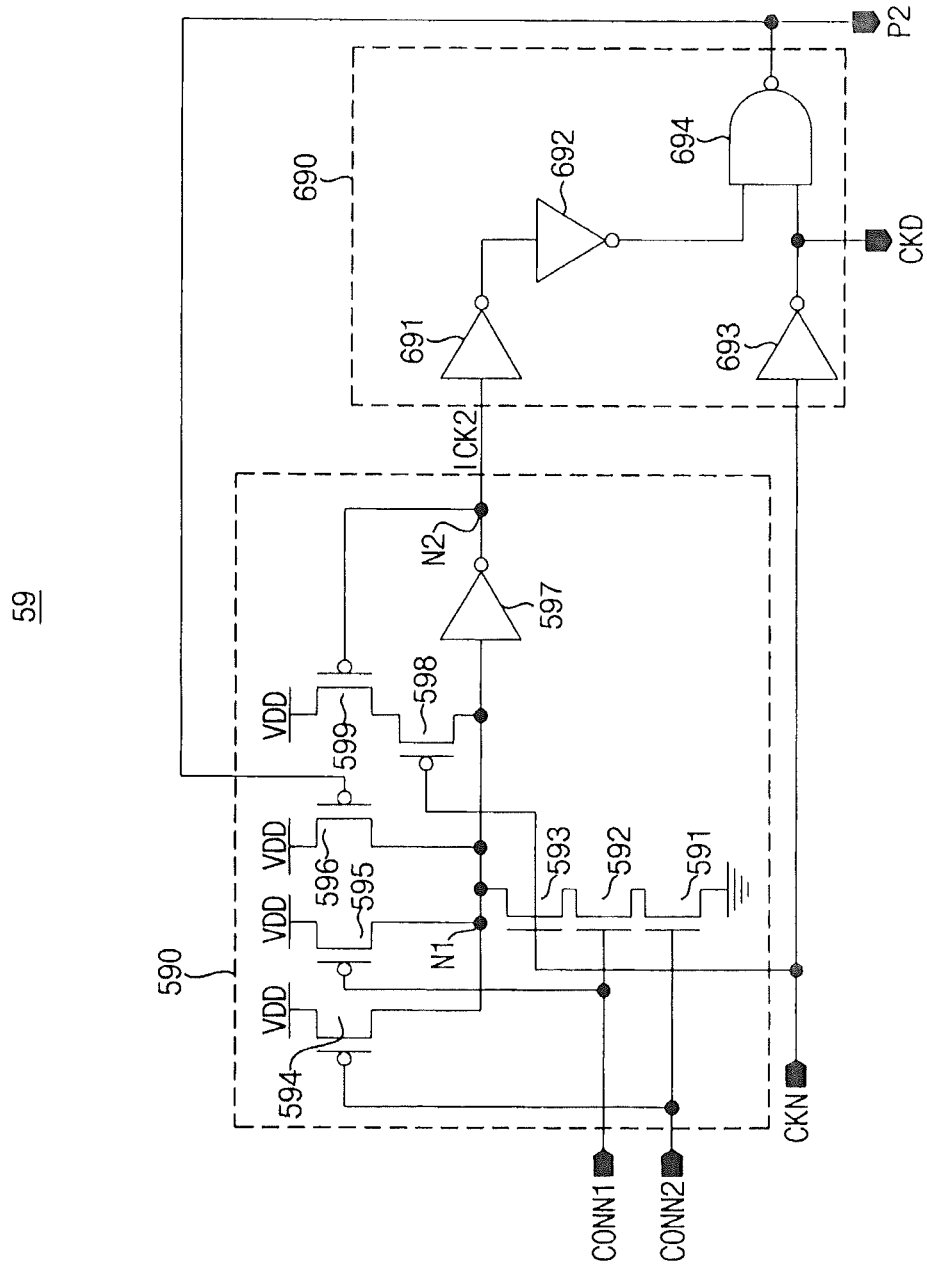
FIG. 22 is a circuit diagram illustrating another example of the pulse generator of FIG. 13 according to some embodiments.

FIG. 22 is a circuit diagram illustrating another example of the pulse generator of FIG. 13 according to some embodiments.

Referring to FIG. 22, a pulse generator 59 includes an internal clock generator circuit 590 and a pulse generator circuit 690.

The internal clock generator circuit 590 includes NMOS transistors 591, 592 and 593, PMOS transistors 594, 595 and 596, an inverter circuit 597, and PMOS transistors 598 and 599. The NMOS transistors 591, 592 and 593 are cascode-connected between the ground and the first node N1. The NMOS transistor 591 has a gate receiving a second control signal CONN2, the NMOS transistor 592 has a gate receiving a first control signal CONN1 and the NMOS transistor 593 has a gate receiving the inverted clock signal CKN. The PMOS transistors 594, 595 and 596 are connected in parallel between the first node N1 and the power supply voltage VDD. The PMOS transistor 594 has a gate receiving the second control signal CONN2, the PMOS transistor 595 has a gate receiving the first control signal CONN1 and the PMOS transistor 596 has a gate receiving the second pulse signal P2. The PMOS transistors 598 and 599 are cascode-connected between the first node N1 and the power supply voltage VDD in parallel with the PMOS transistor 596. The PMOS transistor 598 is connected between the first node N1 and the PMOS transistor 599 and has a gate receiving the inverted clock signal CKN. The PMOS transistor 599 is connected between the PMOS transistor 598 and the power supply voltage VDD and has a gate receiving the internal clock signal ICK2. The gate of the PMOS transistor 599 is connected to the second node N2. The inverter circuit 597 inverts a logic level of the first node N1 to provide the internal clock signal ICK2 at the second node N2.

The pulse generator circuit 690 includes inverter circuits 691, 692 and 693 and a NAND gate 694. The inverter circuit 691 inverts the internal clock signal ICK2. The inverter circuit 692 inverts an output of the inverter circuit 691. The inverter circuit 693 inverts the inverted clock signal CKN to provide a delayed clock signal CKD. The NAND gate 694 performs a NAND operation on the delayed clock signal CKD and an output of the inverter circuit 692 to provide the second pulse signal P2. The second pulse signal P2 is provided to the gate of the PMOS transistor 596 in the internal clock generator circuit 590.

Hereinafter, there will be description on operation of the pulse generator 59.

When both of the first and second control signals CONN1 and CONN2 are high level, the NMOS transistors 591 and 592 are turned on and the PMOS transistors 594 and 595 are turned off. Therefore, architecture of the pulse generator 59 is substantially the same as architecture of the pulse generator 54 of FIG. 17, and thus operation of the pulse generator 59 will not be repeated.

When at least one of the first and second control signals CONN1 and CONN2 is low level, at least one of the PMOS transistors 594 and 595 are turned on and the first node N1 is precharged to a level of the power supply voltage VDD. When the first node N1 is precharged to a level of the power supply voltage VDD, the internal clock signal ICK2 transitions to a low level and the output of the inverter circuit 691 transitions to a high level. When the output of the inverter circuit 691 transitions to a high level, the second pulse signal P2, output of the NAND gate 694, is activated with a high level without regard to logic level of the inverted clock signal CKN. That is, the pulse generator 59 of FIG. 22 may control deactivating interval of the second pulse signal P2 by the first and second control signals CONN1 and CONN2.

Figure 23:
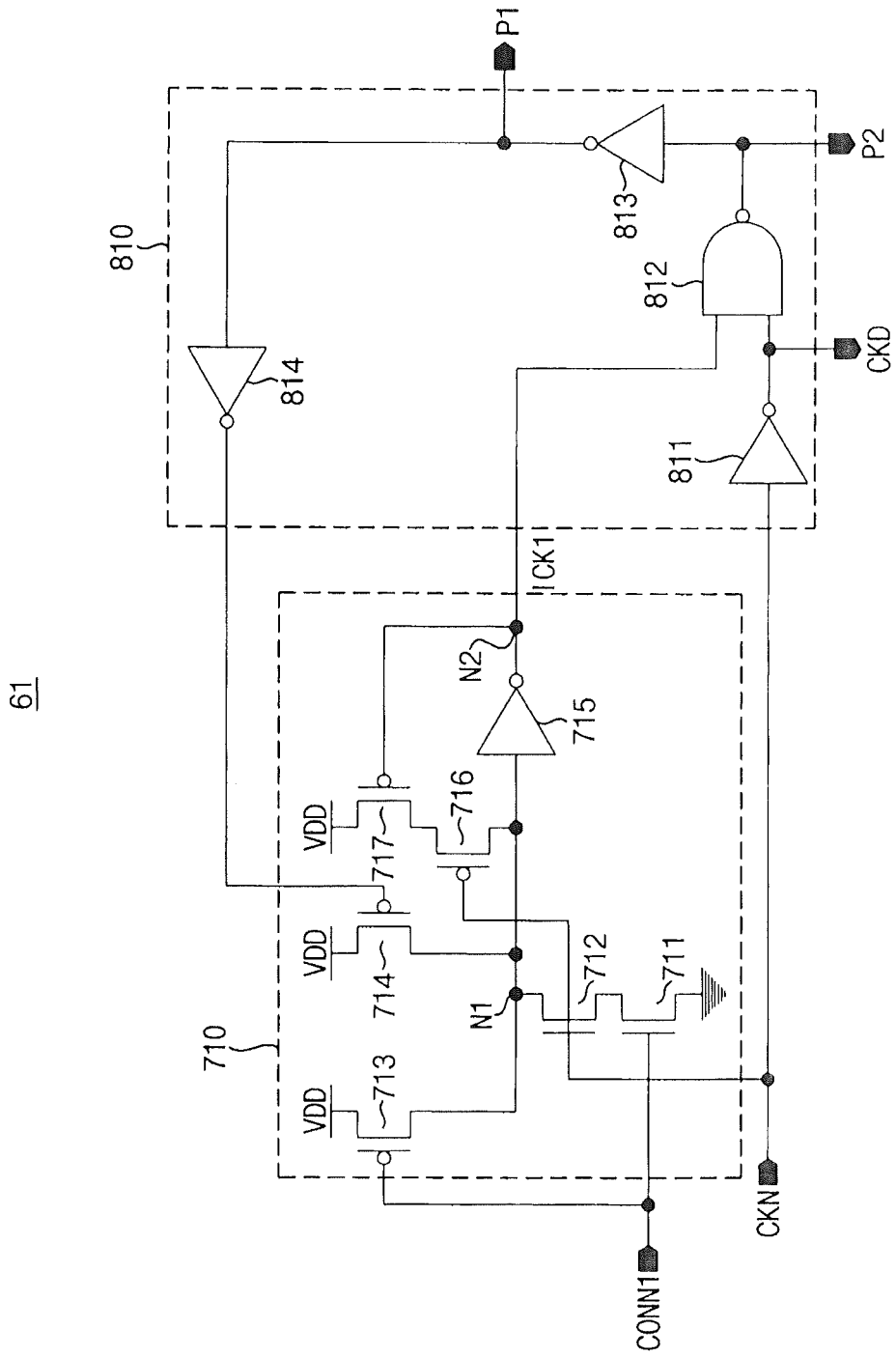
FIG. 23 is a circuit diagram illustrating another example of the pulse generator of FIG. 13 according to some embodiments.

FIG. 23 is a circuit diagram illustrating another example of the pulse generator of FIG. 13 according to some embodiments.

Referring to FIG. 23, a pulse generator 61 includes an internal clock generator circuit 710 and a pulse generator circuit 810.

The internal clock generator circuit 710 includes NMOS transistors 711 and 712, PMOS transistors 713 and 714, an inverter circuit 715, and PMOS transistors 716 and 717. The NMOS transistors 711 and 712 are connected between the ground and the first node N1. The NMOS transistor 711 has a gate receiving a first control signal CONN1, and the NMOS transistor 712 has a gate receiving the inverted clock signal CKN. The PMOS transistors 713 and 714 are connected in parallel between the first node N1 and the power supply voltage VDD. The PMOS transistor 713 has a gate receiving the first control signal CONN1 and the PMOS transistor 714 has a gate receiving the second pulse signal P2. The PMOS transistors 716 and 717 are cascode-connected between the first node N1 and the power supply voltage VDD in parallel with the PMOS transistor 714. The PMOS transistor 716 is connected between the first node N1 and the PMOS transistor 717 and has a gate receiving the inverted clock signal CKN. The PMOS transistor 717 is connected between the PMOS transistor 716 and the power supply voltage VDD and has a gate receiving the internal clock signal ICK2. The gate of the PMOS transistor 717 is connected to the second node N2. The inverter circuit 565 inverts a logic level of the first node N1 to provide the internal clock signal ICK2 at the second node N2.

The pulse generator circuit 810 includes an inverter circuit 811, a NAND gate 812 and inverter circuits 813 and 814. The inverter circuit 811 inverts the clock signal CK to provide a delayed clock signal CKD. The NAND gate 812 performs a NAND operation on the delayed clock signal CKD and the internal clock signal ICK2 to provide the second pulse signal P2. The inverter circuit 813 inverts the second pulse signal P2 to provide the first pulse signal P1. The inverter circuit 814 inverts the first pulse signal P1 to provide a delayed second pulse signal. The delayed second pulse signal is provided to the gate of the PMOS transistor 714 in the internal clock generator circuit 710.

When the first control signal CONN1 is a high level, the NMOS transistor 711 is turned on and the PMOS transistor 713 is turned off. Therefore, architecture of the pulse generator 61 is substantially the same as architecture of the pulse generator 55 of FIG. 18, and thus operation of the pulse generator 61 will not be repeated.

When the first control signal CONN1 is a low level, the NMOS transistor 711 is turned off and the PMOS transistor 713 is turned on. When the PMOS transistor 713 is turned on, the first node N1 is precharged to a level of the power supply voltage VDD. When the first node N1 is precharged to a level of the power supply voltage VDD, the internal clock signal ICK2 transitions to a low level. When the internal clock signal ICK2 transitions to a low level, the second pulse signal P2, output of the NAND gate 812, is activated with a high level without regard to logic level of the inverted clock signal CKN. That is, the pulse generator 61 of FIG. 21 may control deactivating interval of the second pulse signal P2 by the first control signal CONN1.

Figure 24:
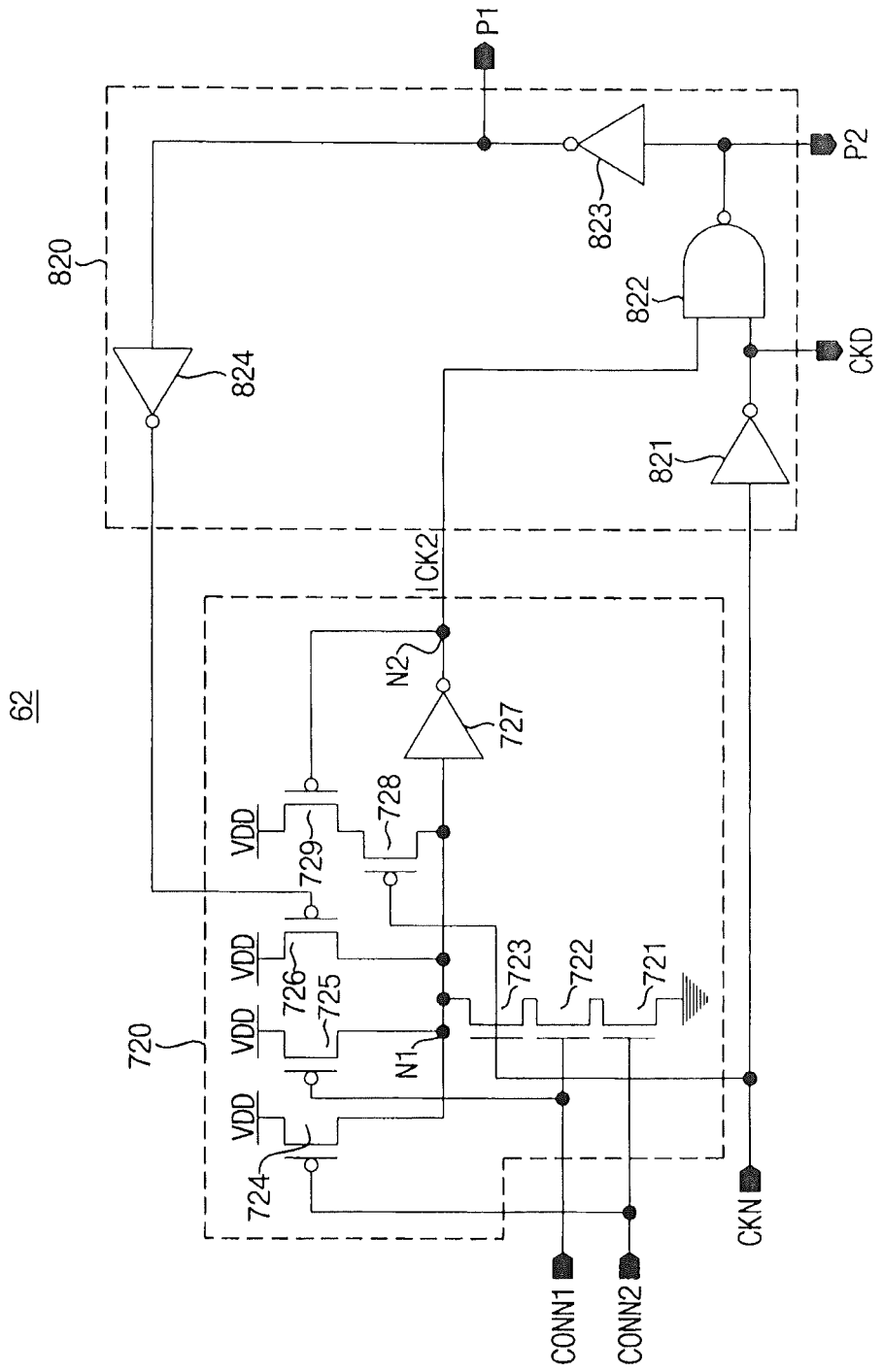
FIG. 24 is a circuit diagram illustrating another example of the pulse generator of FIG. 13 according to some embodiments.

FIG. 24 is a circuit diagram illustrating another example of the pulse generator of FIG. 13 according to some embodiments.

Referring to FIG. 24, a pulse generator 62 includes an internal clock generator circuit 720 and a pulse generator circuit 820.

The internal clock generator circuit 720 includes NMOS transistors 721, 722 and 723, PMOS transistors 724, 725 and 726, an inverter circuit 727, and PMOS transistors 728 and 729. The NMOS transistors 721, 722 and 723 are cascode-connected between the ground and the first node N1. The NMOS transistor 721 has a gate receiving a second control signal CONN2, the NMOS transistor 722 has a gate receiving a first control signal CONN1 and the NMOS transistor 723 has a gate receiving the inverted clock signal CKN. The PMOS transistors 724, 725 and 726 are connected in parallel between the first node N1 and the power supply voltage VDD. The PMOS transistor 724 has a gate receiving the second control signal CONN2, the PMOS transistor 725 has a gate receiving the first control signal CONN1 and the PMOS transistor 726 has a gate receiving the second pulse signal P2. The PMOS transistors 728 and 729 are cascode-connected between the first node N1 and the power supply voltage VDD in parallel with the PMOS transistor 726. The PMOS transistor 728 is connected between the first node N1 and the PMOS transistor 729 and has a gate receiving the inverted clock signal CKN. The PMOS transistor 729 is connected between the PMOS transistor 728 and the power supply voltage VDD and has a gate receiving the internal clock signal ICK2. The gate of the PMOS transistor 729 is connected to the second node N2. The inverter circuit 727 inverts a logic level of the first node N1 to provide the internal clock signal ICK2 at the second node N2.

Hereinafter, there will be description on operation of the pulse generator 62.

When both of the first and second control signals CONN1 and CONN2 are high level, the NMOS transistors 721 and 722 are turned on and the PMOS transistors 724 and 725 are turned off. Therefore, architecture of the pulse generator 62 is substantially the same as architecture of the pulse generator 55 of FIG. 18, and thus operation of the pulse generator 62 will not be repeated.

When at least one of the first and second control signals CONN1 and CONN2 is low level, at least one of the PMOS transistors 724 and 725 are turned on and the first node N1 is precharged to a level of the power supply voltage VDD. When the first node N1 is precharged to a level of the power supply voltage VDD, the internal clock signal ICK2 transitions to a low level. When the internal clock signal ICK2 transitions to a low level, output of the NAND gate 822, is activated with a high level without regard to logic level of the inverted clock signal CKN. That is, the pulse generator 62 of FIG. 24 may control deactivating interval of the second pulse signal P2 by the first and second control signals CONN1 and CONN2.

The pulse generator described with FIGS. 13 through 24, may use the first pulse signal P1 and the second pulse signal P2. When the first pulse signal P1 is used, the pulse width of the first pulse signal P1 may be controlled by the control signal CON. When the second pulse signal P2 is used, the deactivating interval of the second pulse signal P2 may be controlled by the control signal CONN.

Figure 25:
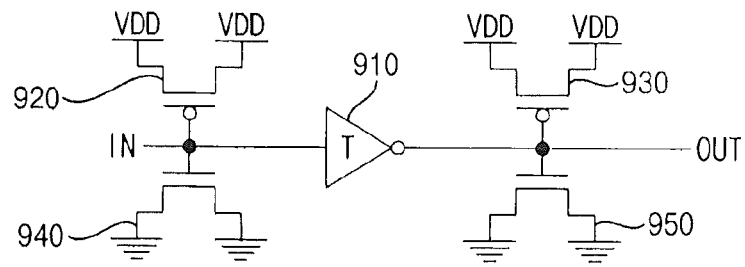
FIG. 25 is a circuit diagram illustrating an example of the inverter circuit included in the pulse generator according to some embodiments.

FIG. 25 is a circuit diagram illustrating an example of the inverter circuit included in the pulse generator according to some embodiments.

Referring to FIG. 25, an inverter circuit 900 may include an inverter 910, at least one MOS capacitor 920 and 940 connected to an input IN of the inverter 910 and/or at least one MOS capacitor 930 and 950 connected to an output OUT of the inverter 910. That is, the inverter circuit 900 may include the inverter 910 or the inverter circuit 900 may include the inverter 910 and at least one of the MOS capacitors 920, 930, 940 and 950.

The MOS capacitors 920 and 930 are a PMOS capacitor having a source and a drain commonly connected to the power supply voltage VDD. The MOS capacitors 940 and 950 are a NMOS capacitor having a source and a drain commonly connected to the ground. In addition, MOS capacitors may be asymmetrically to the input IN and/or output of the inverter 910 such that delay of the inverter circuit 900 may be increased.

FIGS. 26A through 26D are circuit diagrams illustrating examples of the inverter in FIG. 25 according to some embodiments.

Figure 26A:
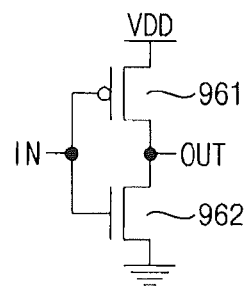
FIGS. 26A through 26D are circuit diagrams illustrating examples of the inverter in FIG. 25 according to some embodiments.

Referring to FIG. 26A, an inverter 960 includes a PMOS transistor 961 and a NMOS transistor 962 which are cascade-connected between the power supply voltage VDD and the ground. Gates of the PMOS transistor 961 and the NMOS transistor 962 are connected to the input IN and drains of the PMOS transistor 961 and the NMOS transistor 962 are connected to the output OUT.

Figure 26B:
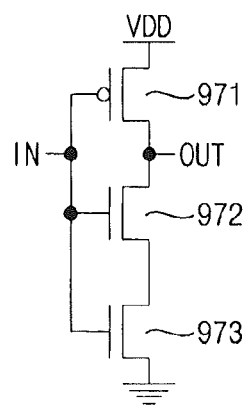

Referring to FIG. 26B, an inverter 970 includes a PMOS transistor 971 and NMOS transistors 972 and 973 which are cascade-connected between the power supply voltage VDD and the ground. Gates of the PMOS transistor 961 and the NMOS transistors 972 and 973 are connected to the input IN and drains of the PMOS transistor 971 and the NMOS transistor 972 are connected to the output OUT.

Figure 26C:
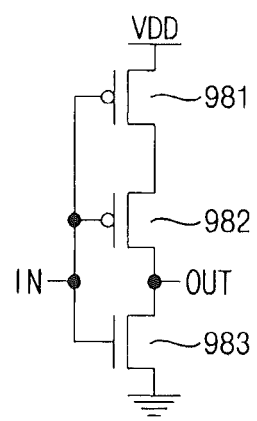
Figure 26D:
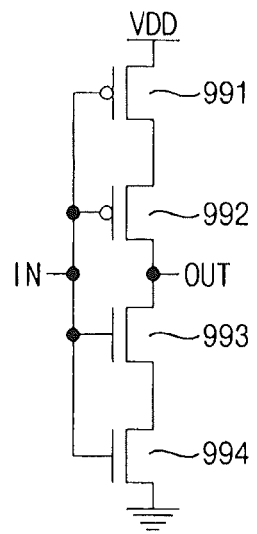

Referring to FIG. 26C, an inverter 980 includes PMOS transistors 981 and 982 and a NMOS transistor 983 which are cascade-connected between the power supply voltage VDD and the ground. Gates of the PMOS transistors 981 and 982 and the NMOS transistor 983 are connected to the input IN and drains of the PMOS transistor 982 and the NMOS transistor 983 are connected to the output OUT, Referring to FIG. 26D, an inverter 990 includes PMOS transistors 991 and 992 and NMOS transistors 993 and 994 which are cascade-connected between the power supply voltage VDD and the ground. Gates of the PMOS transistors 991 and 992 and the NMOS transistors 993 and 994 are connected to the input IN and drains of the PMOS transistor 992 and the NMOS transistor 993 are connected to the output OUT.

Figure 27:
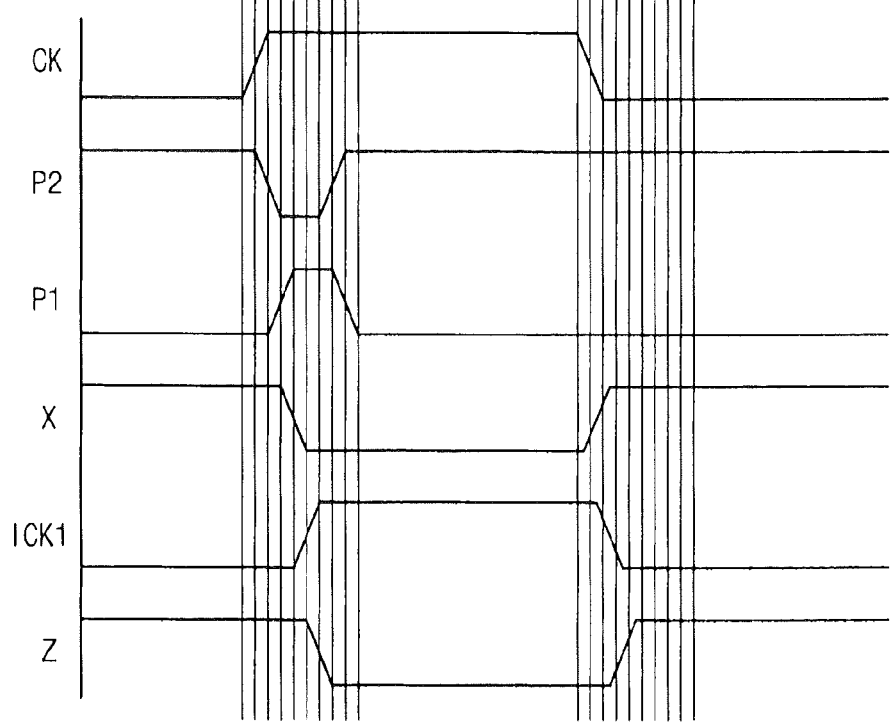
FIG. 27 is a timing diagram illustrating operation of the pulse generator of FIG. 7.

FIG. 27 is a timing diagram illustrating operation of the pulse generator of FIG. 7.

Referring to FIGS. 7 and 27, when the first control signal CON1 is a high level, the PMOS transistor 161 is turned off and the NMOS transistor 163 is turned on. When the NMOS transistor 163 is turned on, the first node N1 (denoted as 'X') is discharged to a level of the ground. When the first node N1 is discharged to a level of the ground, the internal clock signal ICK1 transitions to a high level and the output (denoted as 'Z') of the inverter circuit 261 transitions to a low level. When the output of the inverter circuit 261 transitions to a low level, the second pulse signal P2 transitions to a high level and the first pulse signal P1 is deactivated with a low level. That is, when the first control signal CON1 is a high level, the first pulse signal P1 is deactivated with a low level without regard to logic level of the clock signal CK.

When the first control signal CON1 is a low level, the PMOS transistor 161 is turned on and the NMOS transistor 163 is turned off. Therefore, architecture of the pulse generator 16 is substantially the same as architecture of the pulse generator 11 of FIG. 2. When the clock signal CK transitions from a low level to a high level, the second pulse signal P2, output of the NAND gate 262, transitions from a high level to a low level, in synchronization with a rising edge of the clock signal CK with some delay. When the second pulse signal P2 transitions from a high level to a low level, in synchronization with a rising edge of the clock signal. CK with some delay, the first pulse signal P1, output of the inverter circuit 263, transitions from a low level to a high level, in synchronization with a rising edge of the clock signal CK with some delay. When the first pulse signal P1 transitions from a low level to a high level, in synchronization with a rising edge of the clock signal CK with some delay, the NMOS transistor 164 is turned on, and the first node N1 is discharged to a level of the ground. When the first node N1 is discharged to the level of the ground, the internal clock signal ICK1 at the second node N2 transitions from a low level to a high level. When the internal clock signal ICK1 at the second node N2 transitions from a low level to a high level, the output of the inverter circuit 261 transitions from a high level to a low level. When the output of the inverter circuit 261 transitions from a high level to a low level, the second pulse signal P2 transitions from a low level to a high level in response to the output of the inverter circuit 263 transitioning to a low level. When the second pulse signal P2 transitions from a low level to a high level, the first pulse signal P1 transitions from a high level to a low level.

The description of timing diagram of FIG. 27 may be similarly applied to operation of the pulse generators of FIGS. 2 through 6 and 8 through 11.

Figure 28:
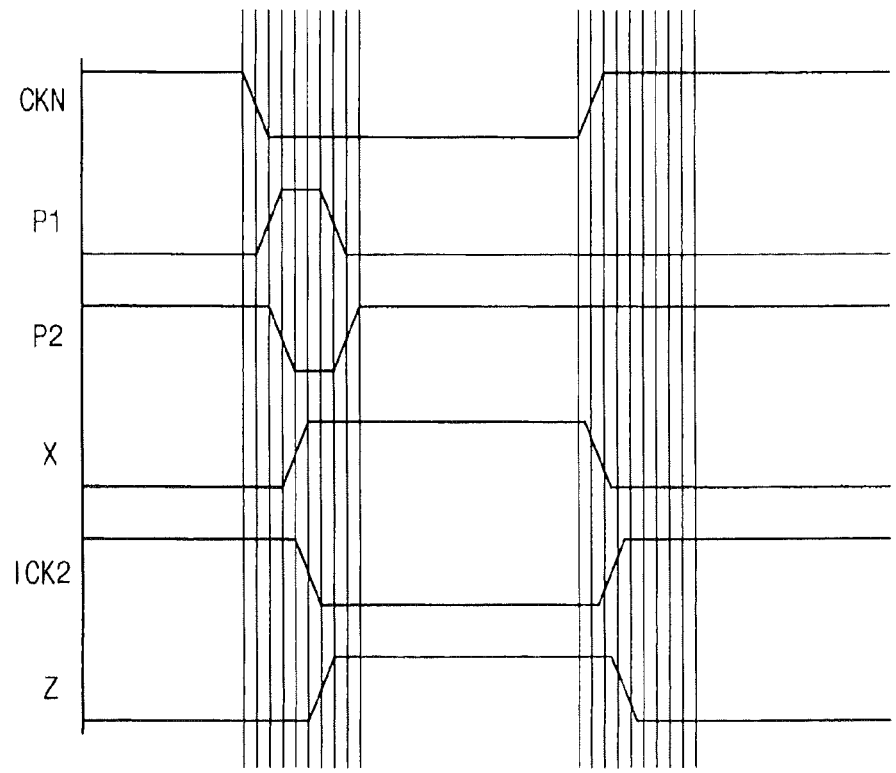
FIG. 28 is a timing diagram illustrating operation of the pulse generator of FIG. 19.

FIG. 28 is a timing diagram illustrating operation of the pulse generator of FIG. 19.

Referring to FIGS. 19 and 28, when the first control signal CONN1 is a low level, the NMOS transistor 561 is turned off and the PMOS transistor 563 is turned on. When the PMOS transistor 563 is turned on, the first node N1 (denoted as 'X') is precharged to a level of the power supply voltage VDD. When the first node N1 is precharged to a level of the power supply voltage VDD, the internal clock signal ICK2 transitions to a low level and the output of the inverter circuit 561 transitions to a high level. When the output (denoted as 'Z') of the inverter circuit 561 transitions to a high level, the first pulse signal P1 transitions to a low level and the second pulse signal P2 is activated with a high level. That is, when the first control signal CONN1 is a low level, the second pulse signal P2 is activated with a high level without regard to logic level of the inverted clock signal CKN.

When the first control signal CONN1 is a high level and the inverted clock signal CKN transitions from a high level to a low level, the first pulse signal P1, output of the NOR gate 662, transitions from a low level to a high level, in synchronization with a falling edge of the inverted clock signal CKN with some delay. When the first pulse signal P1 transitions from a low level to a high level, in synchronization with a falling edge of the inverted clock signal CKN with some delay, the second pulse signal P2, output of the inverter circuit 613, transitions from a high level to a low level, in synchronization with a falling edge of the inverted clock signal CKN with some delay. When the second pulse signal P2 transitions from a high level to a low level, in synchronization with a falling edge of the inverted clock signal CKN with some delay, the PMOS transistor 562 is turned on, and the first node N1 is precharged to a level of the power supply voltage VDD. When the first node N1 is precharged to a level of the power supply voltage VDD, the internal clock signal ICK2 at the second node N2 transitions from a high level to a low level. When the internal clock signal ICK2 at the second node N2 transitions from a high level to a low level, the output of the inverter circuit 661 transitions from a low level to a high level. When the output of the inverter circuit 661 transitions from a low level to a high level, the first pulse signal P1 transitions from a high level to a low level in response to the output of the inverter circuit 661 transitioning to a high level. When the first pulse signal P1 transitions from a high level to a low level, the second pulse signal P2 transitions from a low level to a high level.

The description of timing diagram of FIG. 28 may be similarly applied to operation of the pulse generators of FIGS. 14 through 18 and 20 through 24.

Figure 29:
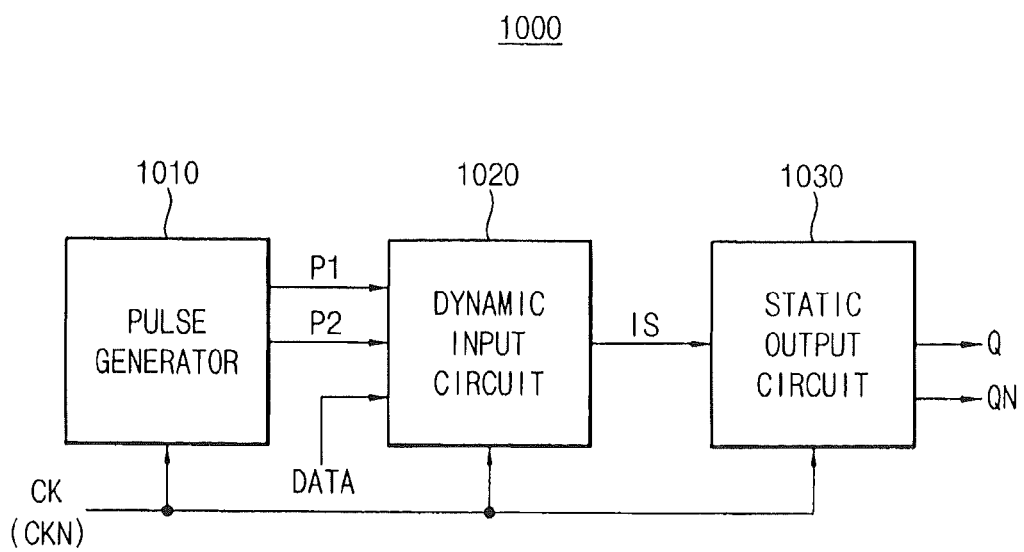
FIG. 29 is a block diagram illustrating a flip-flop circuit including the pulse generator according to some embodiments.

FIG. 29 is a block diagram illustrating a flip-flop circuit including the pulse generator according to some embodiments. The flip-flop circuit 1000 includes a pulse generator 1010, a dynamic input circuit 1020 and a static output circuit 1030. The flip-flop circuit 1000 may be included in an integrated circuit device.

The pulse generator 1010 generates first and second pulse signal P1 and P2 based on at least clock signals CK and CKN. The dynamic input circuit 1020 evaluates input data DATA and generates an internal signal IS in response to the clock signal CK and the pulse signals P1 and P2. The static output circuit 1030 maintains status of output data Q or inverts the internal signal IS to provide the output data Q according to a phase of the clock signal CK. The static output circuit 1030 also outputs an inverted output data QN. The static output circuit 1030 may employ one of the pulse generators of FIGS. 1 through 24.

Figure 30:
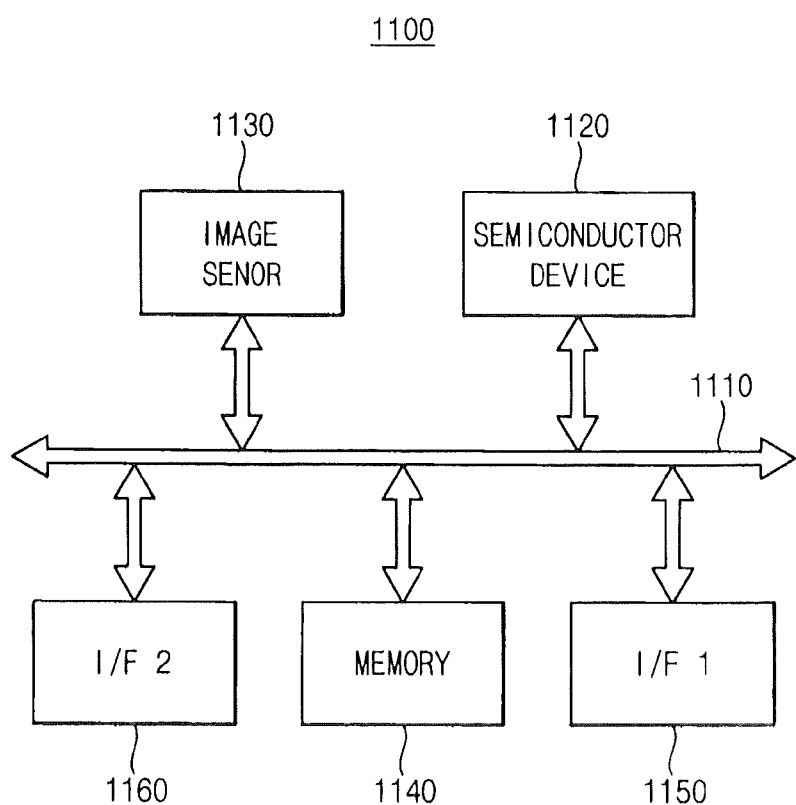
FIG. 30 is a block diagram illustrating an electronic device including a semiconductor device having the flip-flop circuit of FIG. 29.

FIG. 30 is a block diagram illustrating an electronic device including a semiconductor device having the flip-flop circuit of FIG. 29.

Referring to FIG. 30, an electronic device 1100 includes a memory device 1140 connected with a system bus 1110 and a semiconductor device 1120. The semiconductor device 1120 may be implemented by a CPU, a DSP, a video/audio chip, an ASIC, a SOC, an MP3 audio chip, a wireless audio chip, an audio codec chip, an MPEG4 codec chip, an h264 codec chip, a video codec chip, a codec chip, or a voice codec chip. The semiconductor device 1120 may control the writing, reading and verification reading operations of the memory device 1140 For instance, the semiconductor device 1120 may communicate data with an external device through an input/output interface (I/F), i.e., a first I/F 1150. The semiconductor device 1120 may communicate data with an image sensor 1130 through the system bus 1110. In addition, the semiconductor device 1120 may communicate data with an external wireless device through a wireless I/F, i.e., a second I/F 1160 via wireless connection.

When the electronic device 1100 is implemented by a portable application, the electronic device 1100 may additionally include a battery (not shown) which supply power to the memory device 1140 and the semiconductor device 1120. The portable application may be a portable computer, a digital camera, a personal digital assistant (PDA), a cellular phone, an MP3 player, a portable multimedia player (PMP), an automotive navigation system, a memory card, a smart card, a game machine, an electronic dictionary, an electronic instrument, a solid state disc, or a solid state drive.

The electronic device 1100 may include the first I/F 1150 to communicate data with an external data processing device. When the electronic device 1100 is a wireless system, the electronic device 1100 may include the semiconductor device 1120, the memory device 1140, and the wireless I/F 1160. At this time, the wireless I/F 1160 connected with the semiconductor device 1120 through the system bus 1110 may communicate data with an external wireless device (not shown) via wireless connection. For instance, the semiconductor device 1120 may process data input through the wireless I/F 1160 and store the processed data in the memory device 1140. The semiconductor device 1120 may also read data from the memory device 1140 and transmit the data to the wireless I/F 1160. The memory device 1140 may include volatile memory, e.g., dynamic random access memory (DRAM) or static random access memory (SRAM), or non-volatile memory. In addition, the memory device 1140 may be a hard disc drive that magnetically stores data. The memory device 1140 may also be a hybrid hard disc drive. The wireless system may be a PDA, a portable computer, a wireless telephone, a pager, a radio frequency identification (RFID) reader, or an RFID system. The wireless system may also be a wireless local area network (WLAN) system or a wireless personal area network (WPAN) system. The wireless system may be a cellular network.

When the electronic device 1100 is an image pickup device, the electronic device 1100 may include the image sensor 1130 which converts an optical signal into an electrical signal. The image sensor 1130 may be an image sensor using a charge-coupled device (CCD) or an image sensor manufactured using a complementary metal-oxide semiconductor (CMOS) process. At this time, the electronic device 1100 may be a digital camera, a mobile phone equipped with a digital camera, or a satellite equipped with a camera.

As mentioned above, the pulse generators are capable of generating pulse signal which maintains pulse width robust to process variation.

The present inventive subject matter may be applied to any type of device requiring high operating speed.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive subject matter. Accordingly, all such modifications are intended to be included within the scope of the present inventive subject matter as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A pulse generator comprising:
a pulse generator circuit configured to receive a clock signal and an internal clock signal and configured to generate a first pulse signal that is synchronized with a rising edge of the clock signal with a delay, the internal clock being synchronized with the clock signal with a delay; and
an internal clock generator circuit configured to delay the first pulse signal to generate the internal clock signal that determines a pulse width of the first pulse signal, based on at least the clock signal and the first pulse signal.

2. The pulse generator of claim 1, wherein the internal clock generator circuit comprises:
at least one p-channel metal oxide semiconductor (PMOS) transistor that has a source connected to a power supply voltage and a gate which receives the clock signal;
at least a first n-channel metal oxide semiconductor (NMOS) transistor that is connected between a first node and a ground and a gate which receive the first pulse signal, the first node being connected to a drain of the PMOS transistor;
an inverter circuit configured to invert a logic level of the first node to provide a second node; and
second and third NMOS transistors, connected between the first node, the second node and the ground, the second NMOS transistor having a gate which receives the clock signal, the third NMOS transistor having a gate which receives the internal clock signal, the internal clock signal being provided at the second node.

3. The pulse generator of claim 2, wherein the internal clock generator circuit further comprises a second PMOS transistor and a fourth NMOS transistor which have gates receiving at least one control signal that determines the pulse width of the first pulse signal, wherein the second PMOS transistor is connected between the power supply voltage and the first PMOS transistor, and wherein the fourth NMOS transistor is connected between the first node and the ground in parallel with the first NMOS transistor.

4. The pulse generator of claim 2, wherein the inverter circuit comprises an inverter configured to invert the logic level of the first node to provide the internal clock signal.

5. The pulse generator of claim 4, wherein the inverter has an input terminal connected to the first node and an output terminal connected to the second node, and wherein the inverter circuit comprises at least one MOS capacitor connected to at least one of the input terminal and the output terminal.

6. The pulse generator of claim 1, wherein the pulse generator circuit comprises:

a first inverter circuit configured to invert the internal clock signal;

a NAND gate configured to perform a NAND operation on the clock signal and an output of the first inverter circuit to generate a second pulse signal which has a phase inverse to a phase of the first pulse signal; and a second inverter circuit configured to invert the second pulse signal to provide the first pulse signal.

7. The pulse generator of claim 1, wherein the pulse generator circuit comprises:

a first inverter circuit configured to invert the internal clock signal;

a second inverter circuit configured to invert an output of the first inverter circuit;

a third inverter circuit configured to invert the clock signal to provide an inverted clock signal; and a NOR gate configured to perform a NOR operation on the inverted clock signal and an output of the second inverter circuit to provide the first pulse signal.

8. The pulse generator of claim 1, wherein the pulse generator circuit comprises:

a first inverter circuit configured to invert the clock signal to provide an inverted clock signal;

a NOR gate configured to perform a NOR operation on the inverted clock signal and the internal clock signal to provide the first pulse signal;

a second inverter circuit configured to invert the first pulse signal to provide a second pulse signal which has a phase inverse to a phase of the first pulse signal; and a third inverter circuit configured to invert the second pulse signal to be provided to the internal clock generator circuit.

9. A pulse generator comprising:

a pulse generator circuit configured to receive an inverted clock signal and an internal clock signal and configured to generate a second pulse signal that is synchronized with a rising edge of the clock signal with a delay, the internal clock signal being synchronized with the clock signal with a delay; and an internal clock generator circuit configured to delay the second pulse signal to generate the internal clock signal that determines a deactivation interval of the second pulse signal, based on at least the inverted clock signal and the second pulse signal.

10. The pulse generator of claim 9, wherein the internal clock generator circuit comprises:

at least a first n-channel channel metal oxide semiconductor (NMOS) transistor that has a source connected to a ground and a gate which receives the inverted clock signal;

at least a first p-channel metal oxide semiconductor (PMOS) transistor that is connected between a first node and a power supply voltage and a gate which receive the second signal, the first node is being connected to a drain of the first NMOS transistor;

an inverter circuit configured to invert a logic level of the first node to provide a second node; and second and third PMOS transistors, connected between the first node, the second node and the power supply voltage, the second PMOS transistor having a gate which receives the inverted clock signal, the third NMOS transistor having a gate which receives the internal clock signal, the internal clock signal being provided at the second node.

11. The pulse generator of claim 10, wherein the internal clock generator circuit further comprises a second NMOS transistor and a fourth PMOS transistor which have gates receiving at least one control signal that determines the pulse width of the second pulse signal, wherein the second NMOS transistor is connected between the ground and the first NMOS transistor, and wherein the fourth PMOS transistor is connected between the first node and the power supply voltage in parallel with the first PMOS transistor.

12. The pulse generator of claim 9, wherein the pulse generator circuit comprises:

a first inverter circuit configured to invert the internal clock signal;

a NOR gate configured to perform a NOR operation on the inverted clock signal and an output of the first inverter circuit to generate a first pulse signal which has a phase inverse to a phase of the second pulse signal; and a second inverter circuit configured to invert the second pulse signal to provide the first pulse signal.

13. The pulse generator of claim 9, wherein the pulse generator circuit comprises:

a first inverter circuit configured to invert the internal clock signal;

a second inverter circuit configured to invert an output of the first inverter circuit;

a third inverter circuit configured to invert the inverted clock signal to provide a delayed clock signal; and a NAND gate configured to perform a NAND operation on the delayed clock signal and an output of the second inverter circuit to provide the second pulse signal.

14. The pulse generator of claim 9, wherein the pulse generator circuit comprises:

a first inverter circuit configured to invert the inverted clock signal to provide a delayed clock signal;

a NAND gate configured to perform a NAND operation on the delayed clock signal and the internal clock signal to provide the second pulse signal;

a second inverter circuit configured to invert the second pulse signal to provide a first pulse signal which has a phase inverse to a phase of the second pulse signal; and a third inverter circuit configured to invert the first pulse signal to be provided to the internal clock generator circuit.

15. An integrated circuit device comprising:

a clock delay circuit configured to receive a clock signal and a pulse signal and to produce an output signal therefrom, the clock delay circuit configured to transition the output signal to a first logic state responsive to a first state of the clock signal and to transition the output signal to a second logic state responsive to a first state transition of the pulse signal; and a pulse generator circuit configured to receive the clock signal and the output signal and to produce the pulse signal therefrom, the pulse generator circuit configured to generate the first state transition in the pulse signal responsive to a transition of the clock signal to a second state and to generate a second state transition in the pulse signal responsive to the transition of the output signal to the second state.

16. The device of claim 15, wherein the first and second state transitions of the pulse signal define a pulse having a duration less than one-half of a period of the clock signal.

17. The device of claim 16, wherein the first state of the clock signal is a logic low state, wherein the second state of the clock signal is a logic high state, wherein the first state transition of the pulse signal is a rising edge and wherein the second state transition of the pulse signal is a falling edge.

18. The device of claim 17, wherein the clock delay circuit comprises:
- an inverter configured to generate the output signal;
- a PMOS transistor having a channel coupled between a power supply node and an input of the inverter and a gate configured to receive the clock signal; and
- a NMOS transistor having a channel coupled between the input of the inverter and a ground node and a gate configured to receive the pulse signal.

19. The device of claim 16, wherein the first state of the clock signal is a logic high state, wherein the second state of the clock signal is a logic low state, wherein the first state transition of the pulse signal is a falling edge and wherein the second state transition of the pulse signal is a rising edge.

20. The device of claim 19, wherein the clock delay circuit comprises:
- an inverter configured to generate the output signal;
- a PMOS transistor having a channel coupled between a power supply node and an input of the inverter and a gate configured to receive the pulse signal; and
- a NMOS transistor having a channel coupled between the input of the inverter and a ground node and a gate configured to receive the clock signal.

* * * * *